(12) United States Patent
Lee et al.

(10) Patent No.: US 9,214,255 B2
(45) Date of Patent: Dec. 15, 2015

(54) P-DOPED CONJUGATED POLYMER ELECTROLYTE AND AN ORGANIC ELECTRONIC DEVICE USING THE SAME

(75) Inventors: Kwang Hee Lee, Gwangju (KR); Sung Heum Park, Gwangju (KR); Young Eup Jin, Gwangju (KR); Byoung Hoon Lee, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 465 days.

(21) Appl. No.: 13/699,879

(22) PCT Filed: Dec. 17, 2010

(86) PCT No.: PCT/KR2010/009043
§ 371 (c)(1),
(2), (4) Date: Nov. 26, 2012

(87) PCT Pub. No.: WO2011/149172
PCT Pub. Date: Dec. 1, 2011

(65) Prior Publication Data
US 2013/0068305 A1    Mar. 21, 2013

(30) Foreign Application Priority Data

May 26, 2010 (KR) .......................... 10-2010-0049303

(51) Int. Cl.
| | |
|---|---|
| *C08G 61/02* | (2006.01) |
| *C08G 61/12* | (2006.01) |
| *H01L 27/30* | (2006.01) |
| *H01L 51/46* | (2006.01) |
| *H01B 1/12* | (2006.01) |
| *H01L 51/00* | (2006.01) |
| *H01L 51/42* | (2006.01) |

(52) U.S. Cl.
CPC ................ *H01B 1/122* (2013.01); *C08G 61/02* (2013.01); *C08G 61/122* (2013.01); *C08G 61/126* (2013.01); *H01L 51/002* (2013.01); *H01L 51/0035* (2013.01); *H01L 51/0036* (2013.01); *H01L 51/0039* (2013.01); *C08G 2261/124* (2013.01); *C08G 2261/1412* (2013.01); *C08G 2261/1452* (2013.01); *C08G 2261/312* (2013.01); *C08G 2261/3142* (2013.01); *C08G 2261/411* (2013.01); *C08G 2261/516* (2013.01); *H01L 27/302* (2013.01); *H01L 51/4226* (2013.01); *H01L 51/4253* (2013.01); *Y02E 10/549* (2013.01)

(58) Field of Classification Search
None
See application file for complete search history.

(56) References Cited

U.S. PATENT DOCUMENTS

2002/0196518 A1 * 12/2002 Xu et al. ....................... 359/245

FOREIGN PATENT DOCUMENTS

| KR | 10-0915503 B1 * | 8/2008 |
| WO | WO 2010/048319 A1 * | 4/2010 |

OTHER PUBLICATIONS

Knoblock et al., "Stacked Conjugated Oligomers as Molecular Models to Examine Interchain Interactions in Conjugated Materials," Journal of the American Chemical Society, vol. 128, No. 42, Oct. 4, 2006, pp. 13680-13681.*
Seo et al., "Electronic Properties at Gold/Conjugated-Polyelectrolyte Interfaces," Advanced Materials, vol. 21, 2009, pp. 1006-1011.*

* cited by examiner

*Primary Examiner* — Robert Sellers
(74) *Attorney, Agent, or Firm* — Nath, Goldberg & Meyer; Joshua B. Goldberg; Christopher Thomas

(57) ABSTRACT

Disclosed are a p-doped conjugated polymer electrolyte and an organic electronic device using the same. The p-doped conjugated polymer electrolyte according to the present invention not only has an outstanding hole-transport capability but can also act as an electron-blocking layer and hence can be used in organic electronic devices, such as organic light-emitting devices or organic solar cells, in order to improve the light-emitting efficiency of the organic light-emitting device or the energy-conversion efficiency of the organic solar cell. Also, because the charge on the p-doped conjugated polymer electrolyte is almost completely neutral, the present invention can solve the problem of anode corrosion and make a positive contribution to increased life-cycle of the device.

19 Claims, 16 Drawing Sheets

P-DOPED CONJUGATED POLYMER ELECTROLYTE AND AN ORGANIC ELECTRONIC DEVICE USING THE SAME

TECHNICAL FIELD

The present invention relates to polymer electrolyte and organic electronic device, and more particularly, to a p-doped conjugated polymer electrolyte and an organic electronic device using the same.

BACKGROUND ART

Since an organic light emitting device (OLED) and an organic solar cell (OSC) have advantages, such as slim profile, simple structure, lightweight, convenient carrying, low cost process in manufacturing, and flexibleness, they are being actively studied at recent years. In particular, many studies to address low light emitting efficiency or low energy conversion efficiency are in progress via improvement of structure in devices together with development of new materials. Among such studies, a PEDOT:PSS polymer is most widely utilized as a material for organic light emitting devices and hole transport layers due to advantages such as solution processability and water solubility, and is also applied for improvement of device structure. However, it was reported that in the case of PEDOT:PSS, severe quenching of excitons occurs at an interface with an active layer, and since PEDOT:PSS exhibits a strong acidity, it may oxidize the positive electrode to have a bad influence on life-cycle and efficiency of devices. Therefore, there is required development of a hole transport material having near-neutrality while enabling stacking via a solution process so as to replace PEDOT:PSS.

DISCLOSURE OF THE INVENTION

Technical Problem

A technical object to be solved by the present invention is to provide a p-doped conjugated polymer electrolyte that may be used as a hole transport material of an organic electronic device while having water solubility and neutrality.

Another object of the present invention is to provide an organic electronic device having enhanced life-cycle and efficiency by using a p-doped conjugated polymer electrolyte as a hole transport material.

Technical Solution

To accomplish the above technical objects, an aspect of the present invention provides a p-doped conjugate polymer electrolyte. The p-doped conjugated polymer electrolyte includes a compound expressed by formula 1:

<Formula 1>

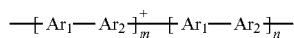

where $Ar_1$ is any one selected from the following first compound group,
$Ar_2$ is any one selected from the following second compound group,
superscript "+" in the square bracket indicates an oxidized portion of a main chain of a polymer,
each of m and n independently represents an integer between 1 and 1,000,000.

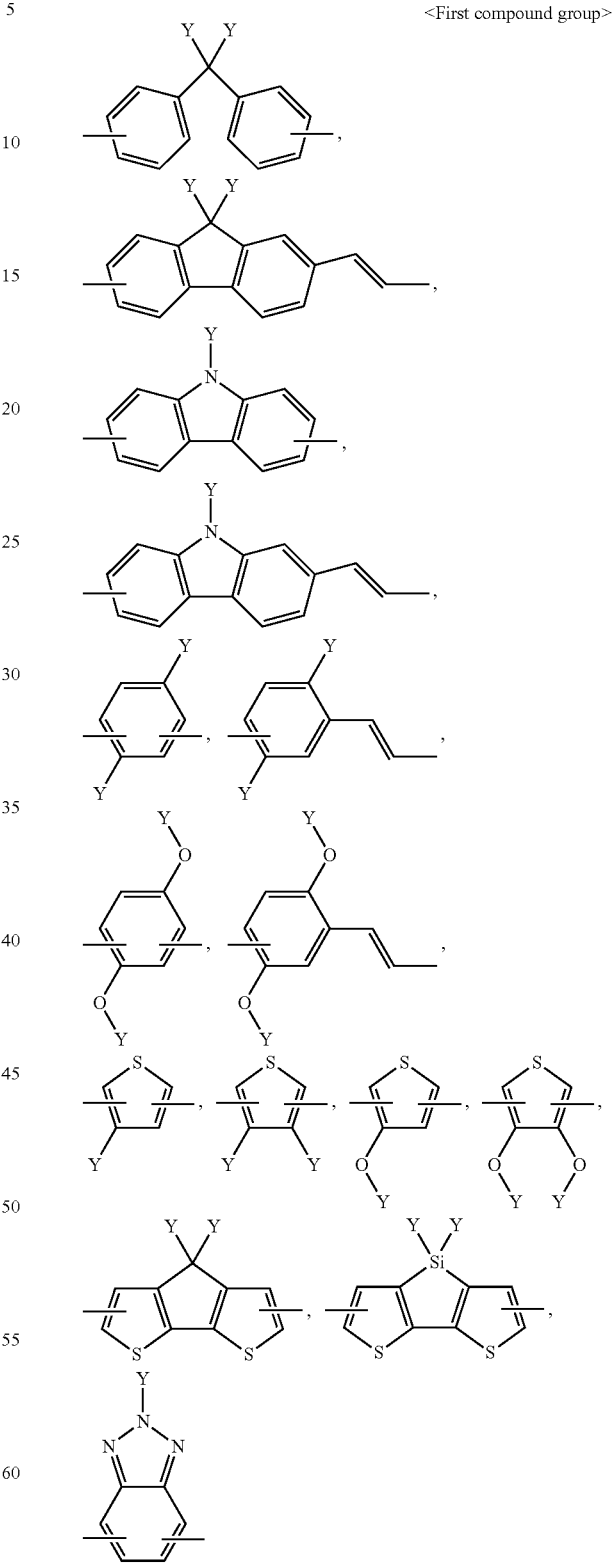

<First compound group>

(Y is $-C_nH_{2n}-X$ (n is an integer between 1 and 20), X is any one of selected from the group consisting of $-SO_3-$, —$CO_2$—, and —$N^+R_1R_2R_3$, and $R_1$, $R_2$, and $R_3$ independently is any one selected from C1 to C3 alkyl groups.)

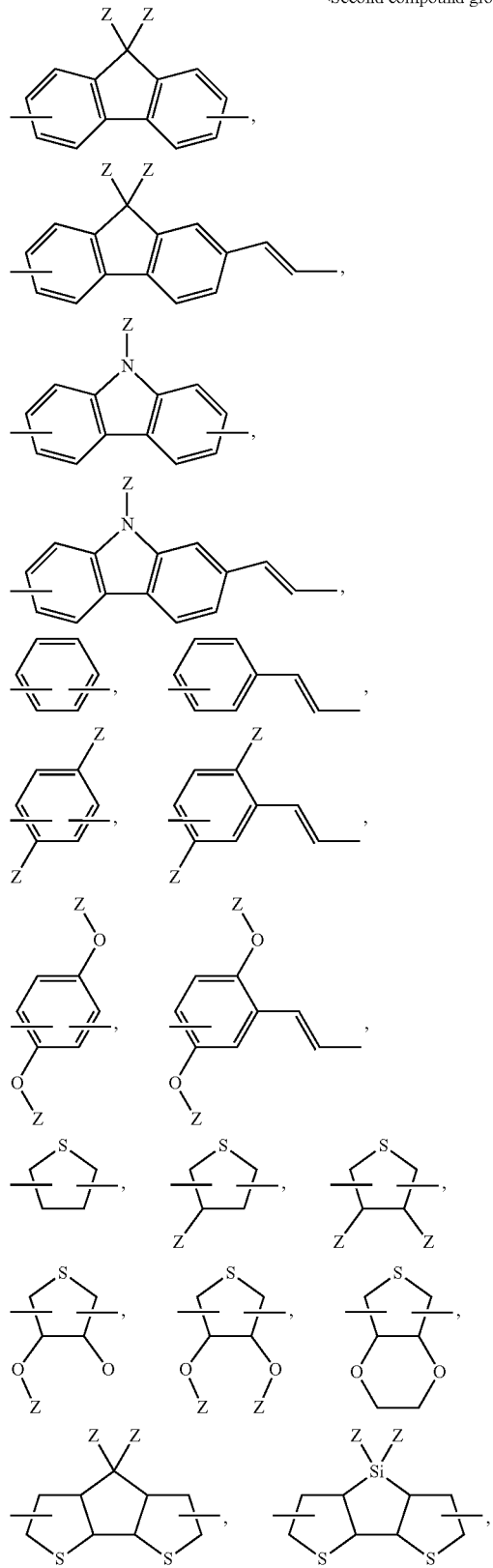

<Second compound group>

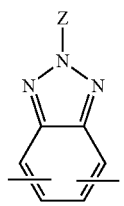

(Z is a C1 to C20 Alkyl Group.)

The p-doped conjugate polymer electrolyte may contain any one selected from the group consisting of $H^+$, $Na^+$, $K^+$, $NH_4^+$, $NMe_4^+$, and $Cs^+$ as a counter positive ion, and any one selected from the group consisting of $Br^-$, $BF_4^-$, $CF_3SO_3^-$, $PF_6^-$, $BPh_4^-$, and $BAr^F_4(B(3,5-(CF_3)_2C_6H_3)_4)$ as a counter negative ion.

To accomplish the above technical objects, another aspect of the present invention provides an organic electronic device including a p-doped conjugate polymer electrolyte. The organic electronic device includes a first electrode, a p-doped conjugate polymer electrolyte layer on the first electrode, an organic active layer on the polymer electrolyte layer, and a second electrode on the organic active layer, wherein the p-doped conjugate polymer electrolyte layer contains a compound expressed by formula 1.

The p-doped conjugate polymer electrolyte layer may contain any one selected from the group consisting of $H^+$, $Na^+$, $K^+$, $NH_4^+$, $NMe_4^+$, and $Cs^+$ as a counter positive ion, and any one selected from the group consisting of $Br^-$, $BF_4^-$, $CF_3SO_3^-$, $PF_6^-$, $BPh_4^-$, and $BAr^F_4(B(3,5-(CF_3)_2C_6H_3)_4)$ as a counter negative ion.

The organic active layer may be a light emitting layer or a photoelectric conversion layer.

Also, the organic electronic device may further include an electron transport layer between the organic active layer and the second electrode.

The electron transport layer may be a titanium oxide layer.

To accomplish the above technical objects, a further aspect of the present invention provides a stack type organic solar cell including a p-doped conjugate polymer electrolyte. The stack type organic solar cell includes a first electrode, a first organic active layer on the first electrode, a charge recombination layer disposed on the first organic active layer and provided with an n-type semiconductor material layer and a p-doped conjugated polymer electrolyte layer, a second organic active layer on the charge recombination layer, and a second electrode on the second organic active layer, wherein the p-doped conjugated polymer electrolyte layer contains a compound expressed by formula 1.

The p-doped conjugate polymer electrolyte layer may contain any one selected from the group consisting of $H^+$, $Na^+$, $K^+$, $NH_4^+$, $NMe_4^+$, and $Cs^+$ as a counter positive ion, and any one selected from the group consisting of $Br^-$, $BF_4^-$, $CF_3SO_3^-$, $PF_6^-$, $BPh_4^-$, and $BAr^F_4(B(3,5-(CF_3)_2C_6H_3)_4)$ as a counter negative ion.

The n-type semiconductor material layer may be a metal oxide layer.

The metal oxide may be at least any one selected from the group consisting of titanium oxide, zinc oxide, tungsten oxide, vanadium oxide, and molybdenum oxide.

Also, the stack type organic solar cell may further include at least one of a hole transport layer and an electron transport layer which are disposed between the first electrode and the first organic active layer, or between the second organic active layer and the second electrode.

In this case, the hole transport layer may be a p-doped conjugate polymer electrolyte layer containing a compound expressed by formula 1, and the p-doped conjugated polymer electrolyte layer may contain any one selected from the group consisting of $H^+$, $Na^+$, $K^+$, $NH_4^+$, $NMe_4^+$, and $Cs^+$ as a counter positive ion, and any one selected from the group consisting of $Br^-$, $BF_4^-$, $CF_3SO_3^-$, $PF_6^-$, $BPh_4^-$, and $BAr^F_4$ ($B(3,5\text{-}(CF_3)_2C_6H_3)_4$) as a counter negative ion.

The electron transport layer may be a titanium oxide layer.

Advantageous Effects

As described above, according to the present invention, since the p-doped conjugated polymer electrolyte may play a role as an electron stop layer as well as having excellent hole transport capability, it may enhance light emitting efficiency of organic light emitting devices or energy conversion efficiency of organic solar cells. Also, since the p-doped conjugated polymer electrolyte exhibits near-neutrality, it can solve a corrosion issue of the positive electrode to thus contribute to life-cycle enhancement of the devices. Meanwhile, in the case of constituting the charge recombination layer that is an intermediate layer of the stack type organic solar cell, by using a p-doped conjugated polymer, an increased open circuit voltage may be obtained only by a room temperature process, and the width of selection to active layer materials that could not use owing to weak heat resistance may be widened, energy conversion efficiency may be maximized.

The effects of the present invention are not limited to the foregoing those, and other effects will be clearly understood to those skilled in the art from the following description.

MODE FOR CARRYING OUT THE INVENTION

Figure 1:
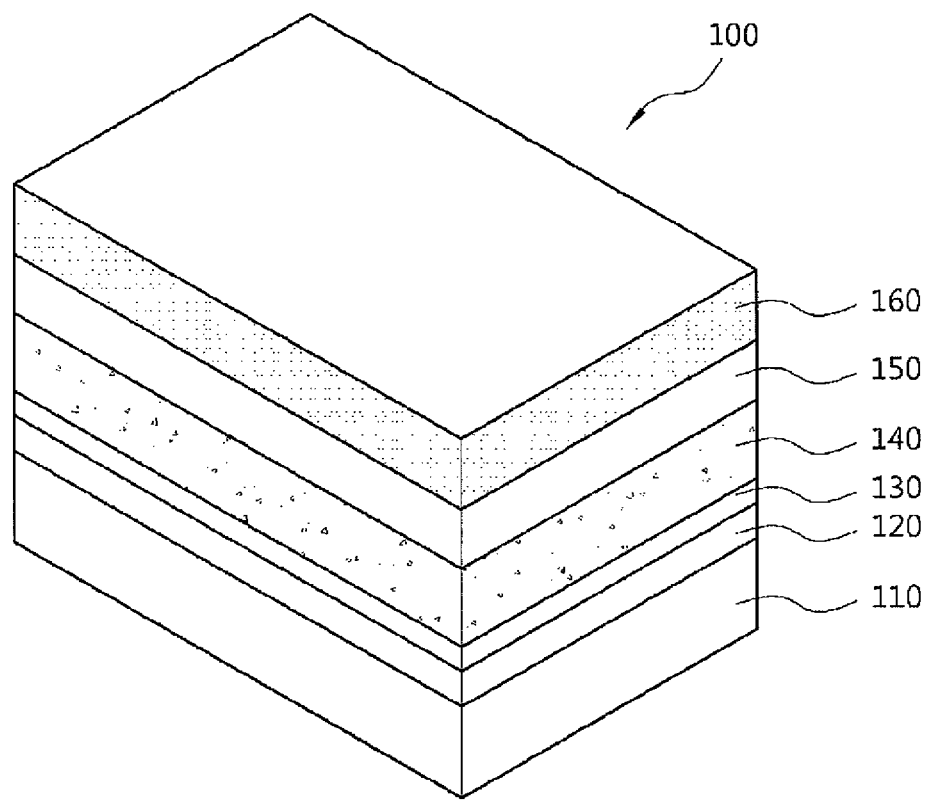
FIG. 1 is a schematic view illustrating an organic electronic device according to an embodiment of the present invention.

Hereinafter, exemplary embodiments will be described in detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Moreover, detailed descriptions related to well-known functions or configurations will be ruled out in order not to unnecessarily obscure subject matters of the present invention.

A p-doped conjugated polymer electrolyte according to an embodiment of the present invention includes a compound expressed by formula 1:

<Formula 1>

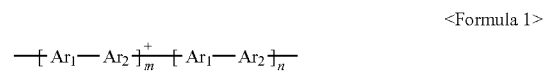

where Ar1 is any one selected from the following first compound group, $Ar_2$ is any one selected from the following second compound group, superscript "+" in the square bracket indicates an oxidized portion of a main chain of a polymer, Each of m and n independently represents an integer between 1 and 1,000,000.

<First compound group>

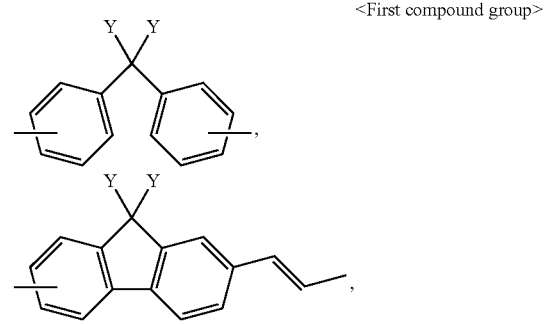

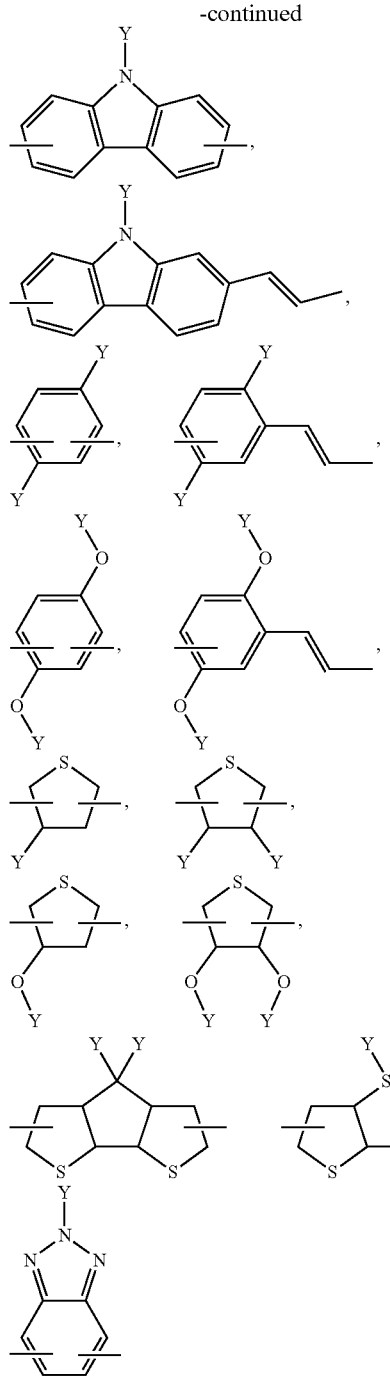
(Y is —$C_nH_{2n}$—X (n is an integer between 1 and 20), X is any one of selected from the group consisting of —$SO_3$—, —$CO_2$—, and —$N^+R_1R_2R_3$, and $R_1$, $R_2$, or $R_3$ is any one selected from C1 to C3 alkyl groups.)
<Second compound group>
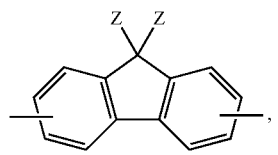
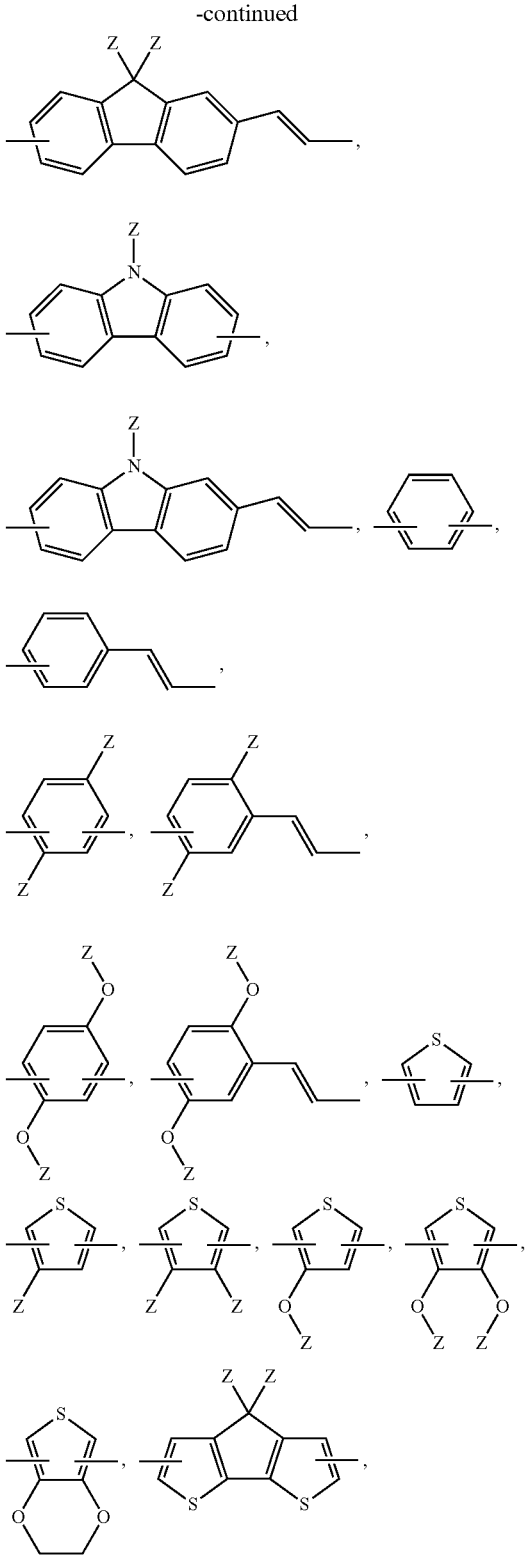

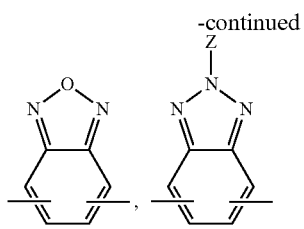

(Z is a C1 to C20 Alkyl Group.)

Together with this, the p-doped conjugate polymer electrolyte may contain any one selected from the group consisting of $H^+$, $Na^+$, $K^+$, $NH_4^+$, $NMe_4^+$, and $Cs^+$ as a counter positive ion, and any one selected from the group consisting of $Br^-$, $BF_4^-$, $CF_3SO_3^-$, $PF_6^-$, $BPh_4^-$, and $BAr^F_4$($B$(3,5-$(CF_3)_2C_6H_3)_4$) as a counter negative ion.

The p-doped conjugate polymer electrolyte may be prepared by an oxidation reaction of a conjugated polymer electrolyte containing a compound having a repeat unit of formula 3.

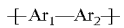
<Formula 3> where $Ar_1$ is any one selected from the above first compound group, $Ar_2$ is any one selected from the above second compound group, Together with this, the p-doped conjugate polymer electrolyte may contain any one selected from the group consisting of $H^+$, $Na^+$, $K^+$, $NH_4^+$, $NMe_4^+$, and $Cs^+$ as a counter positive ion, and any one selected from the group consisting of $Br^-$, $BF_4^-$, $CF_3SO_3^-$, $PF_6^-$, $BPh_4^-$, and $BAr^F_4$($B$(3,5-$(CF_3)_2C_6H_3)_4$) as a counter negative ion.

The oxidation reaction of the polymer electrolyte having the repeat unit of formula 3 is not particularly limited, and may be induced, for example, by adding an acid or an oxidizing agent to the conjugated polymer compound, or performing a coating of conjugated polymer electrolyte to form a polymer electrolyte layer and then using cyclo voltammetry.

In a preferred embodiment, the p-doped conjugated polymer electrolyte may be a compound (p-doped PFP-Na) expressed by formula 2.

The substrate 110 is used to support the organic electronic device, and may be a light transmitting inorganic substrate selected from glass, quartz, $Al_2O_3$, and SiC, or a light transmitting plastic substrate selected from PET (polyethylene terephthalate), PES (polyethersulfone), PS (polystyrene), PC (polycarbonate), PI (polyimide), PEN (polyethylene naphthalate), and PAR (polyarylate).

The first electrode 120 may be a light transmitting electrode. The first electrode 120 may be an ITO (Indium Tin Oxide) film, an FTO (Fluorinated Tin Oxide) film, an IZO (Indium Zinc Oxide) film, an AZO (Al-doped Zinc Oxide) film, a ZnO (Zinc Oxide) film, or an IZTO (Indium Zinc Tin Oxide) film.

The p-doped conjugated polymer electrolyte layer 130 exhibits characteristics of electrolyte by being provided with a conjugated polymer having a charge at a side chain and an oxidized portion in a main chain, and a charge opposite to the charge which the side chain has, as a counter ion. The p-doped conjugated polymer electrolyte layer 130 may function as a hole transport layer to easily transport holes supplied via an external circuit from the first electrode 120 to the organic active layer 140 (in the case of organic light emitting devices), or to easily transport holes generated in the organic active layer 140 to the first electrode 120 (in the case of organic solar cells). Together with this, the p-doped polymer electrolyte layer 130 may function as a buffer layer to alleviate surface roughness of the first electrode 120. Also, since a lower unoccupied molecular orbital (LUMO) level of the p-doped conjugated polymer electrolyte layer 130 is higher than the LUMO level of the organic active layer 140, the p-doped conjugated polymer electrolyte layer 130 may function as an electron stop layer to block electrons from being introduced into the first electrode 120 from the organic active layer 140.

The p-doped conjugated polymer electrolyte 130 may contain a compound expressed by formula 1:

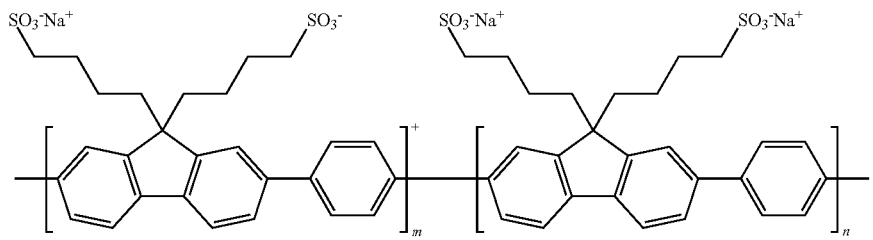
<Formula 2>

(where superscript "+" indicates an oxidized portion of the main chain of the polymer, and Each of m and n independently represents an integer between 1 and 1,000,000.)

FIG. 1 is a schematic view illustrating an organic electronic device 10 according to an embodiment of the present invention.

Referring to FIG. 1, a first electrode 120, a p-doped conjugated polymer electrolyte layer 130, an organic active layer 140, an electron transport layer 150, and a second electrode 160 may be sequentially formed on a substrate 110. Herein, the electron transport layer 150 may be omitted.

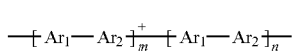
<Formula 1> where $Ar_1$ is any one selected from the following first compound group, $Ar_2$ is any one selected from the following second compound group, superscript "+" in the square bracket indicates an oxidized portion of a main chain of a polymer, each of m and n independently represents an integer between 1 and 1,000,000.
<First compound group>
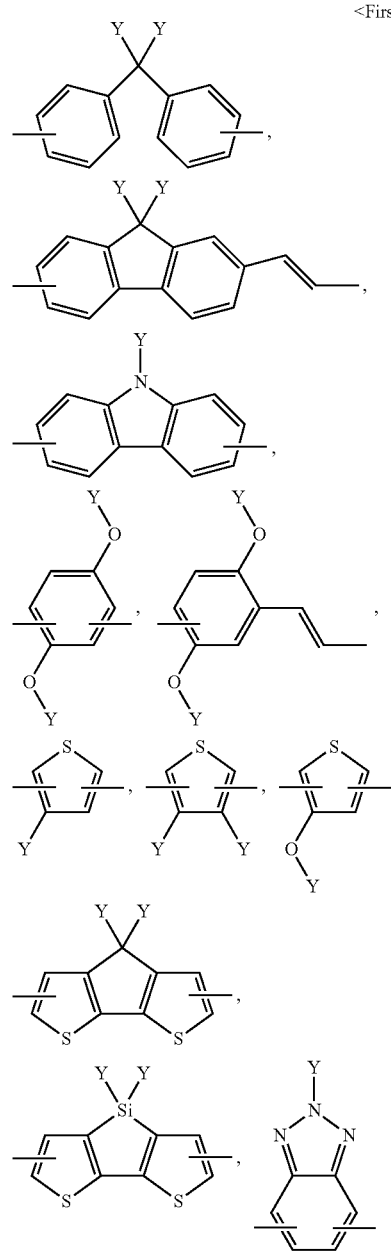
(Y is —$C_nH_{2n}$—X (n is an integer between 1 and 20), X is any one of selected from the group consisting of —$SO_3$—, —$CO_2$—, and —$N^+R_1R_2R_3$, and $R_1$, $R_2$, or $R_3$ is any one selected from C1 to C3 alkyl groups.)
<Second compound group>
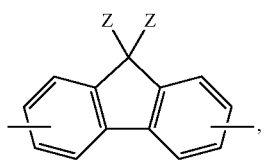
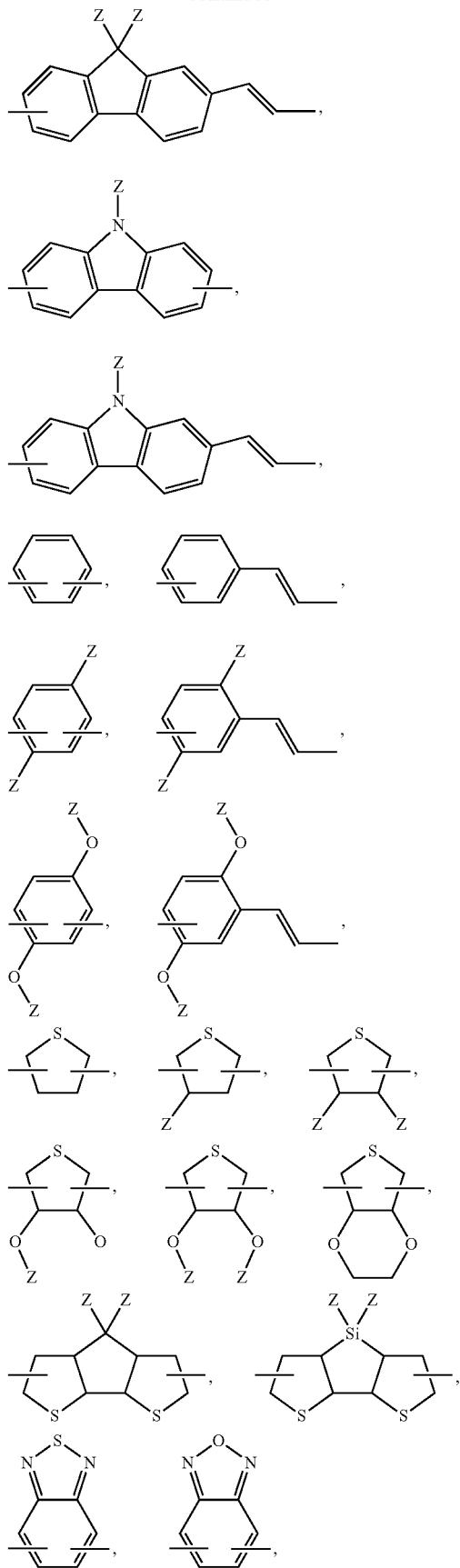

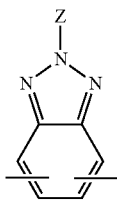

(Z is a C1 to C20 Alkyl Group.)

Together with this, the p-doped conjugate polymer electrolyte layer 130 may contain any one selected from the group consisting of $H^+$, $Na^+$, $K^+$, $NH_4^+$, $NMe_4^+$, and $Cs^+$ as a counter positive ion, and any one selected from the group consisting of $Br^-$, $BF_4^-$, $CF_3SO_3^-$, $PF_6^-$, $BPh_4^-$, and $BAr^F_4$ $(B(3,5-(CF_3)_2C_6H_3)_4)$ as a counter negative ion.

In a preferred embodiment, the p-doped conjugated polymer electrolyte layer 130 may contain a compound (p-doped PFP-Na) expressed by formula 2.

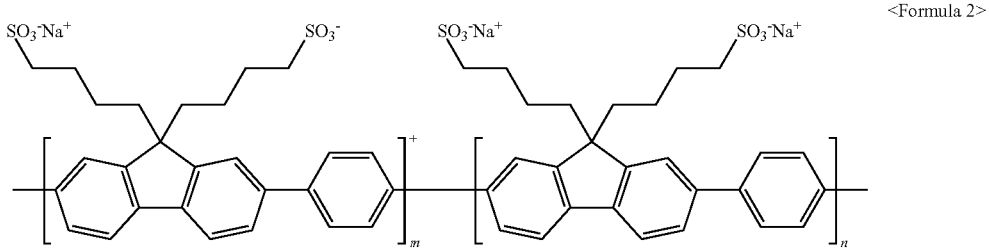

<Formula 2>

(where superscript "+" indicates an oxidized portion of the main chain of the polymer, and each of m and n independently represents an integer between 1 and 1,000,000.)

The organic active layer 140 may be a light emitting layer or a photoelectric conversion layer. Herein, the light emitting layer means a layer generating light by combination of electrons and holes supplied from an outside, and the photoelectric conversion layer means a layer where electron-hole pairs (excitons) are generated by external light and separation into respective charges occurs. In the case of constituting the organic active layer as the light emitting layer or the photoelectric conversion layer, the organic electronic device 100 may be manufactured into an organic light emitting device or an organic solar cell.

The material of the light emitting layer and the photoelectric conversion layer is not particularly limited, and various polymers or low molecular organic materials may be used.

For example, the material of the light emitting layer may be selected from polyaniline, polypyrrole, polyacetylene, poly (3,4-ethylenedioxythiophene) (PEDOT), polyphenylenevinylene (PPV), polyfluorene, polyparaphenylene (PPP), polyalkylthiophene, polypyridine (PPy), polyvinylcarbazole, or copolymers thereof, or may be selected from appropriate host/dopant materials.

For example, the material of an electron donor material in the photoelectric conversion layer may be polythiophene, polyfluorene, polyaniline, polycarbazole, polyvinylcarbazole, polyphenylene, polyphenylvinylene, polysilane, polyisothianaphthanene, polythiazole, polybenzothiazole, polythiopheneoxide, or copolymers thereof. In an example, the electron donor material may be one of polythiophenes, such as poly(3-hexylthiophene) (P3HT), or may be a copolymer of the above polymers, such as PCPDTBT (poly[2,6-(4,4-bis- (2-ethylhexyl)-4H-cyclopenta[2,1-b;3,4-b']dithiophene)-alt-4,7-(2,1,3-benzothiadiazole)], PCDTBT (poly[N-9''-heptadecanyl-2,7-carbazole-alt-5,5-(4',7'-di-2-thienyl-2',1',3'-benzothiadiazole)]), or PFDTBT (poly(2,7-(9-(2'-ethylhexyl)-9-hexyl-fluorene)-alt-5,5-(4',7'-di-2-thienyl-2', 1',3'-benzothiadiazole))). Also, for example, the electron acceptor material of the photoelectric conversion layer may be C60 to C84 fullerenes or derivatives thereof, perylenes, polymers or quantum dots. The fullerene derivatives may be PCBM, for example, PCBM (C60)([6,6]-phenyl-C61-butyric acid methyl ester) or PCBM (C70)([6,6]-phenyl-C71-butyric acid methyl ester).

The electron transport layer 150 may play a role to easily transport electrons supplied via an external circuit from the second electrode 160 to the organic active layer 140 (in the case of organic light emitting devices), or to easily transport electrons generated in the organic active layer 140 to the second electrode 160 (in the case of organic solar cells). Together with this, the electron transport layer 150 may play a role as a hole stop layer to block holes generated in the organic active layer 140 from being introduced into the second electrode 150. The electron transport layer 150 may be a titanium oxide layer, for example. The titanium oxide layer may prevent degradation of devices due to permeation of oxygen or vapor into the organic active layer 140, and may play a role as an optical spacer to increase the amount of light introduced into the organic active layer 140 and also as a life-cycle increasing layer to increase life-cycle of the organic electronic devices. The titanium oxide layer may be formed by using a sol-gel method.

The second electrode 160 may be a metal or a conductive polymer electrode having a lower work function than the first electrode 120. In an example, the second electrode 160 may be any one metal electrode selected from the group consisting of Li, Mg, Ca, Ba, Al, Cu, Ag, Au, W, Ni, Zn, Ti, Zr, Hf, Cd, Pd, Cs, and alloys thereof. In case the second electrode 160 is a metal electrode, the second electrode 160 may be formed by a thermal vapor deposition, an electronic beam deposition, a sputtering, or a chemical deposition, or by coating a metal-containing paste for formation of electrodes and thermally annealing the coated paste. However, the present invention is not limited thereto.

Figure 2:
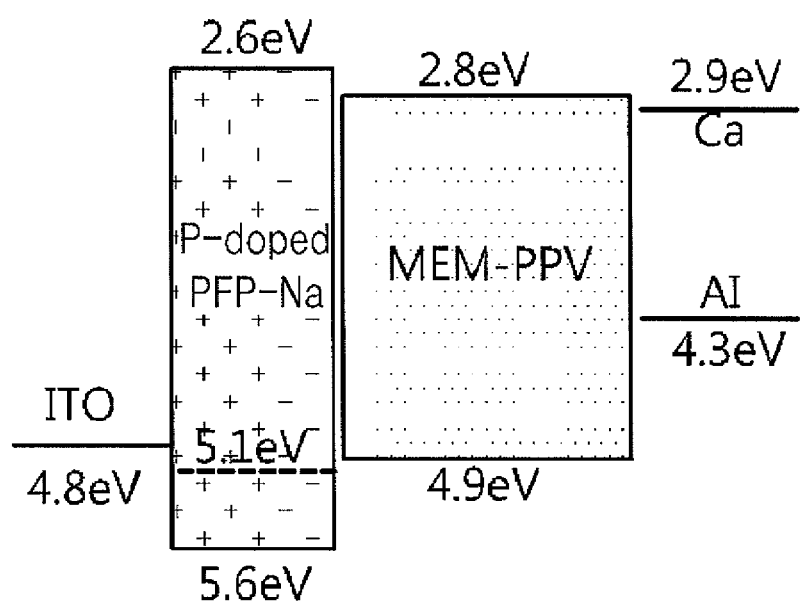
FIG. 2 is a specific example of the organic electronic device explained with reference to FIG. 1, and illustrates an energy diagram of an organic light emitting device.

FIG. 2 is a specific example of the organic electronic device 100 explained with reference to FIG. 1, and illustrates an energy diagram of an organic light emitting device. Specifically, a case where the first electrode is an ITO film, the p-doped conjugated polymer electrolyte layer is a p-doped PFP-Na layer, the organic active layer is an MEH-PPV layer, and the second electrode is a Ca/Al layer is illustrated. Herein, the electron transport layer is omitted.

Figure 3:
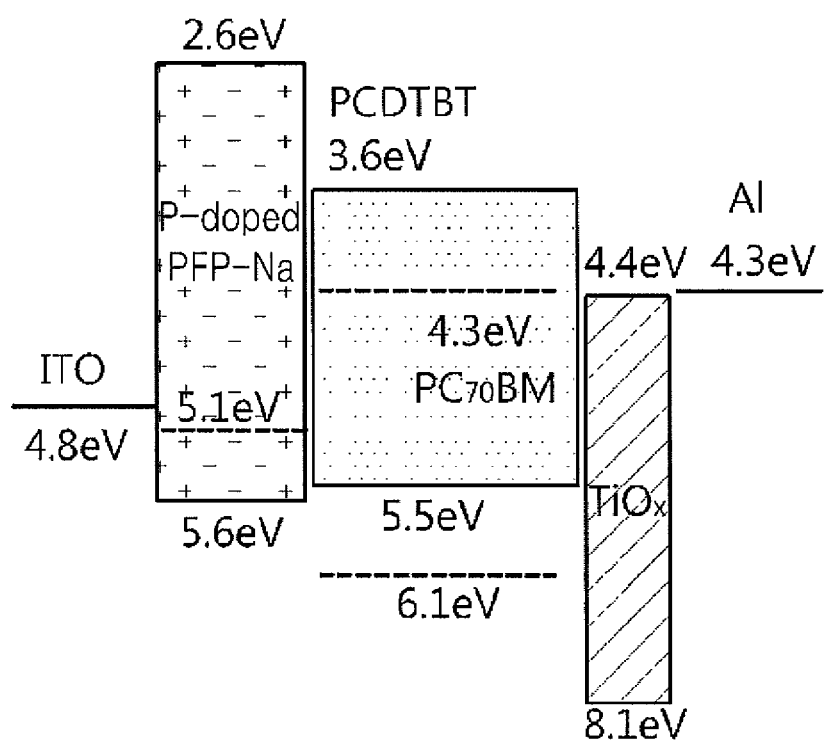
FIG. 3 is a specific example of the organic electronic device explained with reference to FIG. 1, and illustrates an energy diagram of an organic solar cell.

FIG. 3 is a specific example of the organic electronic device 100 explained with reference to FIG. 1, and illustrates an energy diagram of an organic solar cell. Specifically, a case where the first electrode is an ITO film, the p-doped conjugated polymer electrolyte layer is a p-doped PFP-Na layer, the organic active layer is a PCDTBT (electron donor): $PC_{70}BM$ (electron acceptor), the electron transport layer is a TiOx layer, and the second electrode is an Al layer is illustrated.

Referring to FIGS. 2 and 3, a lowest unoccupied molecular orbital (LUMO) level of the p-doped conjugated polymer electrolyte layer is 2.6 eV, which is higher than the LUMO level 2.8 eV of the MEH-PPV layer, (absolute value is smaller than), and is higher (smaller in absolute value) than the LUMO level 4.3 eV of the electron acceptor material, $PC_{70}BM$, and the LUMO level 3.6 eV of the electron donor material, PCDTBT. As a result, the p-doped conjugated polymer electrolyte layer (p-doped PFP-Na layer) may suppress the introduction of electrons from the organic active layer (MEH-PPV layer or PCDTBT:$PC_{70}BM$ layer). Meanwhile, a highest occupied molecular orbital (HOMO) level of the conjugated polymer electrolyte layer (p-undoped PFP-Na layer) is 5.6 eV, which is lower (greater in absolute value) than the HOMO level 4.9 eV of the MEH-PPV layer of the organic light emitting device, and is lower (greater in absolute value) than the HOMO level 5.5 eV of the electron donor material, PCDTBT in the PCDTBT:$PC_{70}BM$ layer of the organic solar cell (absolute value is greater than). A difference in the HOMO level may hinder transport of holes to the MEH-PPV layer or transport of holes from the PCDTBT:$PC_{70}BM$, but since a new hole transport level (indicated by a dotted line, about 5.1 eV) is formed in the p-doped conjugated polymer electrolyte layer (p-doped PFP-Na) by the p-doping, the transport of holes may be smoothened.

Also, since PEDOT:PSS which is mainly used as the hole transport layer of typical organic electronic devices has a high acidity, it may decrease the durability of the devices, for example, corrode the ITO film, thus having a bad influence on the life-cycle of the devices. However, since the p-doped conjugate polymer electrolyte has a nearly neutral pH, in the case of using the p-doped conjugated polymer electrolyte as a material for the hole transport layer, the stability and life-cycle of the devices may be enhanced.

Figure 4:
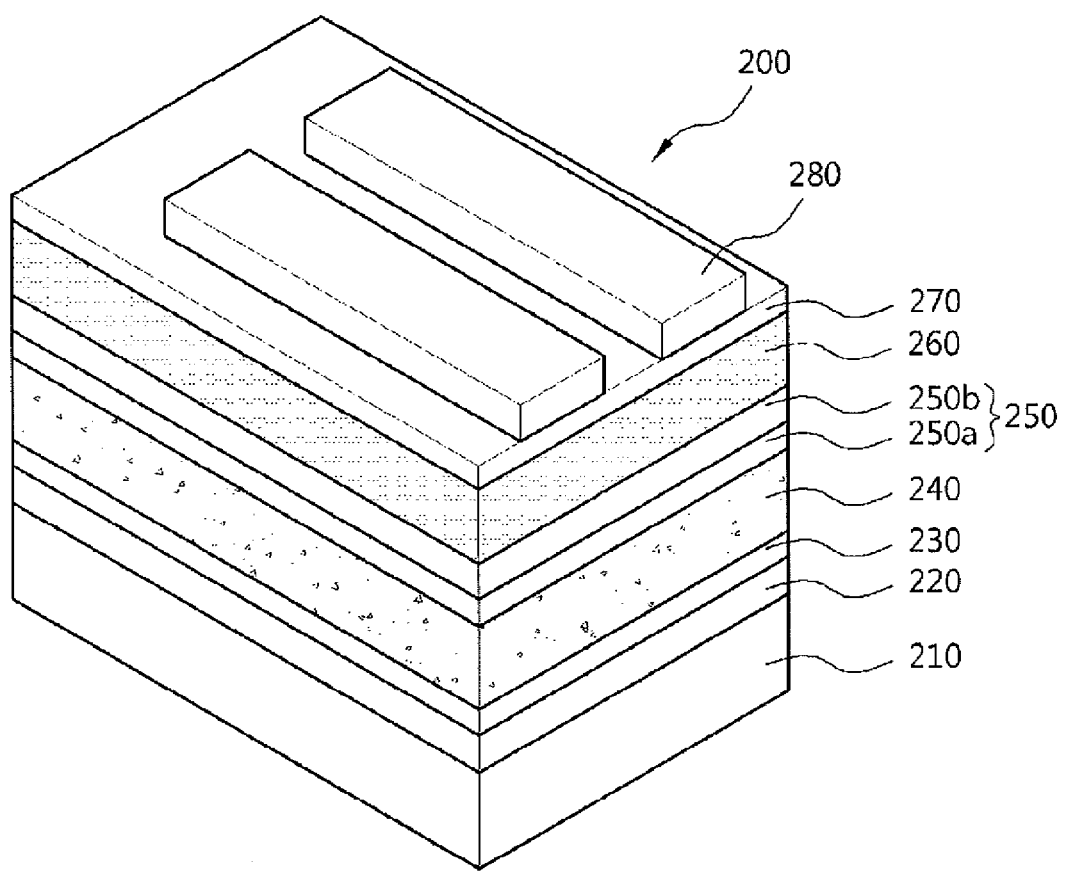
FIG. 4 is a schematic view illustrating a stack type organic solar cell according to another embodiment of the present invention.

FIG. 4 is a schematic view illustrating a stack type organic solar cell 200 according to another embodiment of the present invention.

Referring to FIG. 4, a first electrode 220, a first charge transport layer 230, a first organic active layer 240, a charge recombination layer 250, a second organic active layer 260, a second charge transport layer 270, and a second electrode 280 may be sequentially formed on a substrate 210. Herein, the first charge transport layer 230 and the second charge transport layer 270 may be omitted.

The substrate 210, the first electrode 220, the first organic active layer 240, the second organic active layer 260, and the second electrode 280 may be similar to the substrate 110, the first electrode 120, the organic active layer (photoelectric conversion layer) 140, and the second electrode of the organic electronic device explained with reference to FIG. 1.

The first charge transport layer 230 may be a hole transport layer to easily transport holes generated in the first organic active layer 240 to the first electrode 220. Together with this, the first charge transport layer 230 may function as a buffer layer to alleviate surface roughness of the first electrode 220. The first charge transport layer 230 may be, for example, a PEDOT:PSS layer or a p-doped conjugated polymer electrolyte layer explained with reference to FIG. 1.

The charge recombination layer 250 is a layer where electrons generated in the first organic active layer 240 recombine with holes generated in the second organic active layer 260, and may include an n-type semiconductor material layer 250*a* adjacent to the first organic active layer 240, and a p-doped conjugated polymer electrolyte layer 250*b* adjacent to the second organic active layer 260.

The n-type semiconductor material layer 250*a* is a material layer into which electrons are easily introduced from the first organic active layer 240 but holes are not easily introduced, and the LUMO or conduction band level of the n-type semiconductor material layer 250*a* is lower (greater in absolute value) than that of the first organic active layer 240, and the HOMO or valence band level of the n-type semiconductor material layer 250*a* may be lower (greater in absolute value) than the HOMO level of the first organic active layer 240. The n-type semiconductor material layer 250*a* may be a metal oxide layer. The metal oxide may be titanium oxide, zinc oxide, tungsten oxide, molybdenum oxide, or any complex thereof.

The p-doped conjugated polymer electrolyte layer 250*b* exhibits characteristics of electrolyte by being provided with a conjugated polymer having a charge at a side chain and an oxidized portion in a main chain, and a charge opposite to the charge which the side chain has, as a counter ion. The LUMO level of the p-doped conjugated polymer electrolyte layer 250*b*, especially the side chain of the polymer electrolyte layer may be higher (smaller in absolute value) than that of the second organic active layer 260. As a result, electrons can be suppressed from being introduced from the second organic active layer 260. On the other hand, since a new hole transport level which is different from that prior to p-doping is formed in the p-doped conjugated polymer electrolyte layer 250*b*, holes may be smoothly transported from the second organic active layer 260 to the p-doped conjugated polymer electrolyte layer 250*b*.

The embodiment explained with reference to FIG. 1 will be referred for concretely illustrate the p-doped conjugated polymer electrolyte layer 250*b*.

Since the LUMO level of the p-doped conjugated polymer electrolyte layer 250*b* is higher (smaller in absolute value) than that of the n-type semiconductor material layer 250*a*, the electrons transported into the n-type semiconductor material layer 250*a* are blocked by the LUMO level of the p-doped conjugated polymer electrolyte layer 250*b* and thus do not further move. Since the HOMO level of the n-doped conjugated polymer electrolyte layer 250*a* is lower (greater in absolute value) than that of the p-doped conjugated polymer electrolyte layer 250*b*, the holes transported into the p-doped conjugated polymer electrolyte layer 250*b* are blocked by the HOMO level of the n-type semiconductor material layer 250*a* and thus do not further move. Therefore, the electrons and holes may be recombined at an interface between the n-type semiconductor material layer 250*a* and the p-doped conjugated polymer electrolyte layer 250*b*.

The second charge transport layer 270 may be an electron transport layer to easily transport electrons generated in the second organic active layer 260 to the second electrode 280. Together with this, the second charge transport layer 270 may play a role as a hole stop layer to suppress the holes generated in the second organic active layer 260 from being introduced into the second electrode 280. The second charge transport layer 270 may be a titanium oxide layer, for example. The titanium oxide layer may prevent degradation of devices due to permeation of oxygen or vapor into the organic active layers 240, 260, and may play a role as an optical spacer to increase the amount of light introduced into the organic active layers 240, 260 and also as a life-cycle increasing layer to increase the life-cycle of the organic electronic devices. The titanium oxide layer may be formed by using a sol-gel method.

Figure 5:
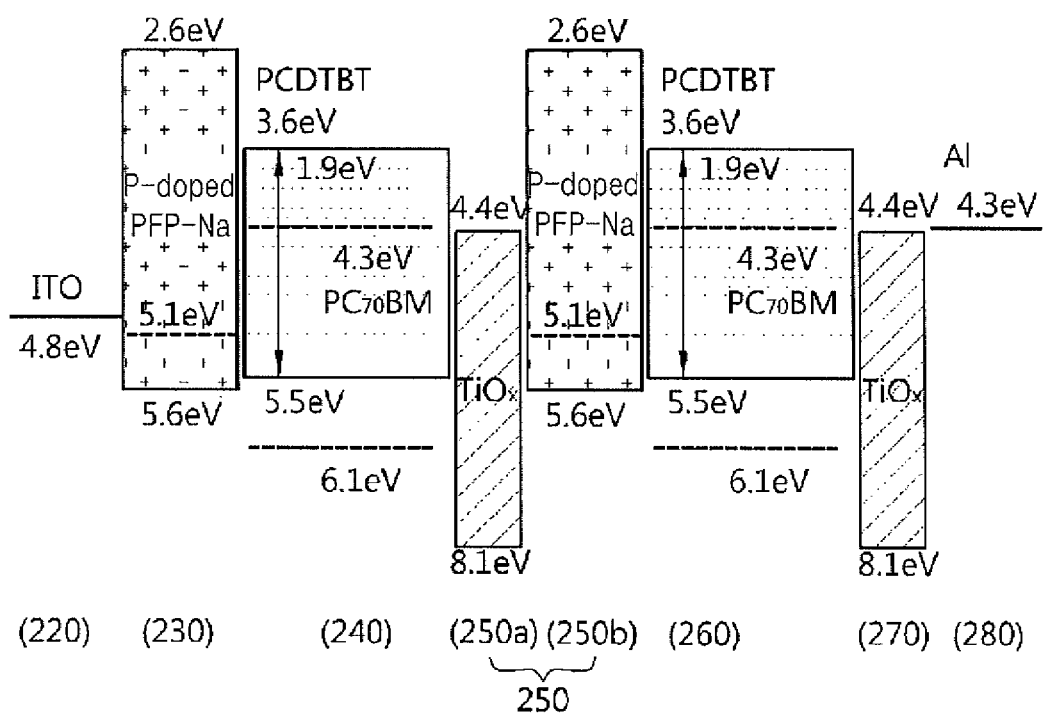
FIG. 5 illustrates an energy diagram for a specific example of the stack type organic solar cell explained with reference to FIG. 4.

FIG. 5 illustrates an energy diagram for a specific example of the stack type organic solar cell 200 explained with reference to FIG. 4. Specifically, a case where the first electrode 220 is an ITO film, the first charge transport layer 230 is a p-doped conjugated polymer electrolyte layer (p-doped PFP-Na layer), the first organic active layer 240 and the second organic active layer 260 are a PCDTBT:$PC_{70}BM$ layer, the charge recombination layer 250 is a TiOx layer 250a and a p-doped conjugated polymer electrolyte layer (p-doped PFP-Na layer 250b sequentially stacked on the first organic active layer 240, the second charge transport layer 270 is a TiOx layer, and the second electrode 280 is an Al layer will be illustrated.

Referring to FIG. 5, a conduction band level of the n-type semiconductor material layer (TiOx layer) 250a is 4.4 eV, which is lower (greater in absolute value) than the LUMO level 4.3 eV of $PC_{70}BM$ which is an electron acceptor material in the first organic active layer (PCDTBT:$PC_{70}BM$ layer) 240 and the LUMO level 3.6 eV of PCDTBT which is an electron donor material. Also, a valence band level of the n-type semiconductor material layer (TiOx layer) 250a is 8.1 eV, which is lower (greater in absolute value) than the HOMO level 5.5 eV of PCDTBT which is an electron donor material in the first organic active layer (PCDTBT:$PC_{70}BM$ layer) 240. Therefore, the introduction of electrons into the n-type semiconductor material layer (TiOx layer) 250a from the first organic active layer (PCDTBT:$PC_{70}BM$ layer) 240 is easy, while the introduction of holes into the n-type semiconductor material layer (TiOx layer) 250a from the first organic active layer (PCDTBT:$PC_{70}BM$ layer) 240 may be not easy.

Meanwhile, A difference in the HOMO level may hinder transport of holes to the MEH-PPV layer or transport of holes from the PCDTBT:$PC_{70}BM$, but since a new hole transport level (indicated by a dotted line, about 5.1 eV) is formed in the p-doped conjugated polymer electrolyte layer (p-doped PFP-Na) by the p-doping, the transport of holes may be smoothened.

Also, the electrons introduced into the n-type semiconductor material layer (TiOx layer) 250a are blocked by the LUMO level of the p-doped conjugated polymer electrolyte layer (p-doped PFP-Na layer) 250b and thus do not further move, and the holes introduced into the p-doped conjugated polymer electrolyte layer (p-doped PFP-Na layer) 250b are blocked by the HOMO level of the n-type semiconductor material layer (TiOx layer) 250a and thus do not further move. Therefore, the electrons and holes may be recombined at an interface between the n-type semiconductor material layer (TiOx layer) 250a and the p-doped conjugated polymer electrolyte layer (p-doped PFP-Na layer) 250b.

Figure 6:
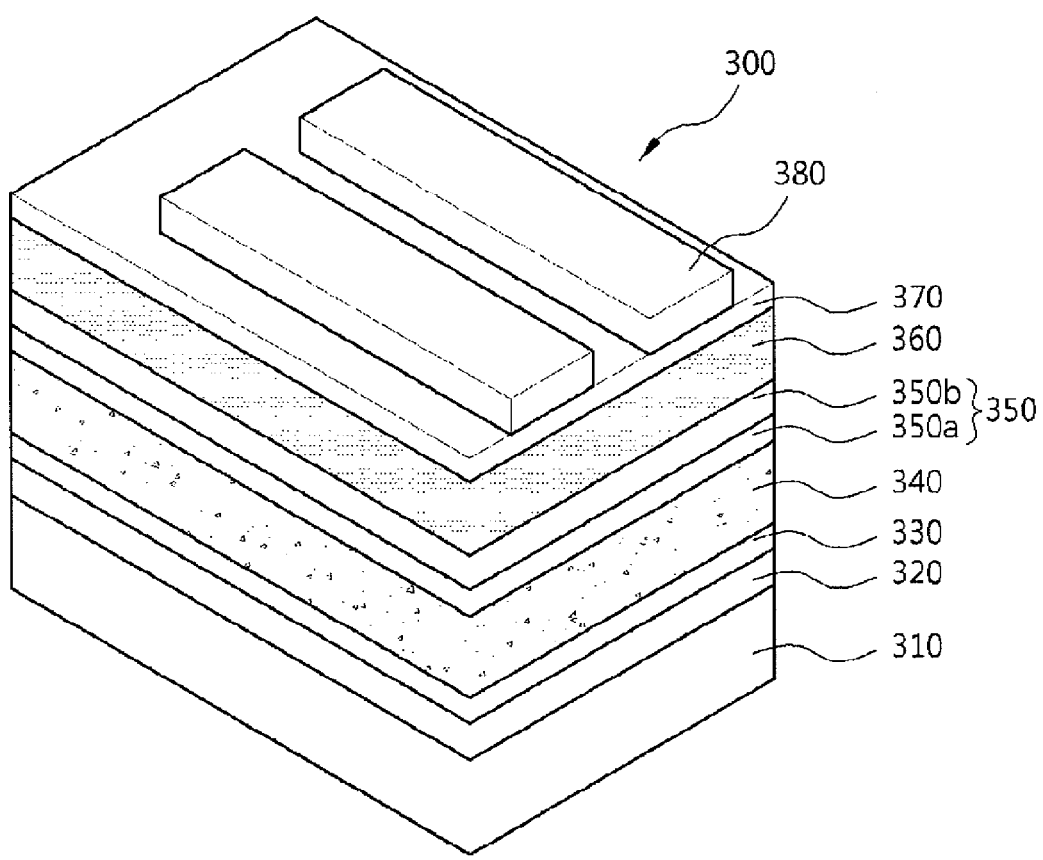
FIG. 6 is a schematic view illustrating a stack type organic solar cell according to another embodiment of the present invention.

FIG. 6 is a schematic view illustrating a stack type organic solar cell 300 according to another embodiment of the present invention.

Referring to FIG. 6, a first electrode 320, a first charge transport layer 330, a first organic active layer 340, a charge recombination layer 350, a second organic active layer 360, a second charge transport layer 370, and a second electrode 380 may be sequentially formed on a substrate 310. Herein, the first charge transport layer 330 and the second charge transport layer 370 may be omitted.

The substrate 310, the first electrode 320, the first organic active layer 340, and the second organic active layer 360 may be similar to the substrate 110, the first electrode 120, and the organic active layer (photoelectric conversion layer) 140 of the organic electronic device explained with reference to FIG. 1.

The first charge transport layer 330 may be an electron transport layer to easily transport electrons generated in the first organic active layer 340 to the first electrode 320. Together with this, the first charge transport layer 330 may function as a buffer layer to alleviate surface roughness of the first electrode 320. The first charge transport layer 330 may be a titanium oxide layer, for example. The titanium oxide layer may be formed by using a sol-gel method.

The charge recombination layer 350 is a layer where holes generated in the first organic active layer 340 recombine with electrons generated in the second organic active layer 360, and may include a p-doped conjugated polymer electrolyte layer 350a adjacent to the first organic active layer 340, and an n-type semiconductor material layer 350b adjacent to the second organic active layer 360.

The p-doped conjugated polymer electrolyte layer 350a exhibits characteristics of electrolyte by being provided with a conjugated polymer having a charge at a side chain and an oxidized portion in a main chain, and a charge opposite to the charge which the side chain has, as a counter ion. The LUMO level of the p-doped conjugated polymer electrolyte layer 350a, especially the main chain of the polymer electrolyte layer may be higher (smaller in absolute value) than that of the first organic active layer 340. As a result, electrons can be suppressed from being introduced from the first organic active layer 340. On the other hand, since a new hole transport level which is different from that prior to p-doping is formed in the p-doped conjugated polymer electrolyte layer 350a, holes may be smoothly transported from the first organic active layer 340 to the p-doped conjugated polymer electrolyte layer 350a.

The embodiment explained with reference to FIG. 1 will be referred for concretely illustrate the p-doped conjugated polymer electrolyte layer 350a.

The n-type semiconductor material layer 350b is a material layer into which electrons are easily introduced from the second organic active layer 360 but holes are not easily introduced, and the LUMO or conduction band level of the n-type semiconductor material layer 350b is lower (greater in absolute value) than that of the second organic active layer 360, and the HOMO or valence band level of the n-type semiconductor material layer 350b may be lower (greater in absolute value) than the HOMO level of the second organic active layer 360. The n-type semiconductor material layer 350b may be a metal oxide layer. The metal oxide may be titanium oxide, zinc oxide, tungsten oxide, molybdenum oxide, or any complex thereof.

Also, since the LUMO level of the p-doped conjugated polymer electrolyte layer 350a is higher (smaller in absolute value) than that of the n-type semiconductor material layer 350b, the electrons introduced into the n-type semiconductor material layer 350b are blocked by the LUMO level of the p-doped conjugated polymer electrolyte layer 350a and thus do not further move. Further, since the HOMO level of the n-type semiconductor material layer 350b is lower (greater in absolute value) than that of the p-doped conjugated polymer electrolyte layer 350a, the holes introduced into the p-doped conjugated polymer electrolyte layer 350a are blocked by the HOMO level of the n-type semiconductor material layer 350b and thus do not further move. Therefore, the electrons and holes may be recombined at an interface between the p-doped conjugated polymer electrolyte layer 350a and the n-type semiconductor material layer 350b.

The second charge transport layer 370 may be a hole transport layer to easily transport holes generated in the second organic active layer 360 to the second electrode 380. The second charge transport layer 370 may be, for example, a PEDOT:PSS layer or a p-doped conjugated polymer electrolyte layer explained with reference to FIG. 1.

The second electrode 380 is an electrode having a higher work function than the first electrode 320, and may be an Au film, for example. However, the present invention is not limited thereto, and in case the second charge transport layer 370 is formed of a PEDOT:PSS layer or the foregoing p-doped conjugated polymer electrolyte layer having a higher work function than the first electrode 320, the second electrode 380 may be formed of a material having a work function equal to or lower than the first electrode 320, for example, Al. The second electrode 380 may be formed by a thermal vapor deposition, an electronic beam deposition, a sputtering, or a chemical deposition, or by coating a metal-containing paste for formation of electrodes and thermally annealing the coated paste. However, the present invention is not limited thereto.

Figure 7:
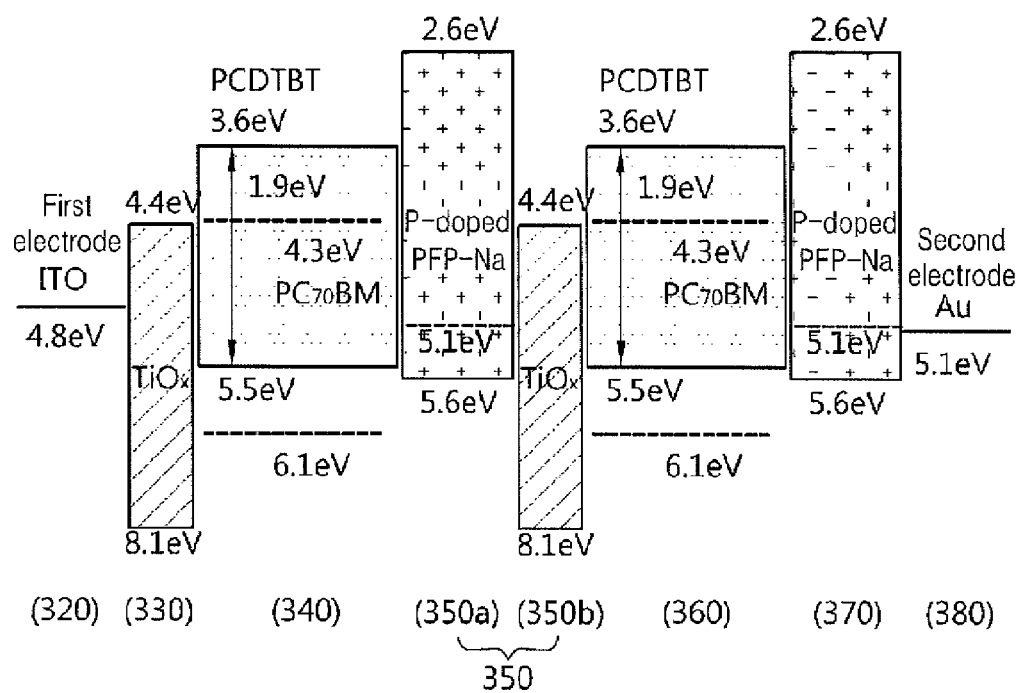
FIG. 7 illustrates an energy diagram for a specific example of the stack type organic solar cell explained with reference to FIG. 6.

FIG. 7 illustrates an energy diagram for a specific example of the stack type organic solar cell 300 explained with reference to FIG. 6. Specifically, a case where the first electrode 320 is an ITO film, the first charge transport layer 330 is a TiOx layer, the first organic active layer 340 and the second organic active layer 360 are a PCDTBT:PC$_{70}$BM layer, the charge recombination layer 350 is a p-doped conjugated polymer electrolyte layer (p-doped PFP-Na layer 350a and a TiOx layer 350b sequentially stacked on the first organic active layer 340, the second charge transport layer 370 is a p-doped conjugated polymer electrolyte layer (p-doped PFP-Na layer), and the second electrode 380 is an Au layer will be illustrated.

Referring to FIG. 7, the LUMO level of the p-doped conjugated polymer electrolyte layer (p-doped PFP-Na layer) 350a is 2.6 eV, which is higher (smaller in absolute value) than the LUMO level 4.3 eV of the PC$_{70}$BM which is an electron acceptor material in the first organic active layer (PCDTBT:PC$_{70}$BM layer) 340, and the LUMO level 3.6 eV of the PCDTBT which is an electron donor material. As a result, electrons may be suppressed from being introduced from the first organic active layer (PCDTBT:PC$_{70}$BM layer). On the other hand, the HOMO level of the conjugated polymer electrolyte layer (p-undoped PFP-Na layer) is 5.6 eV, which is lower (greater in absolute value) than the HOMO level 5.5 eV of the PCDTBT which is an electron donor material in the first organic active layer (PCDTBT:PC$_{70}$BM layer) 340. A difference in the HOMO level may hinder transport of holes from the first organic active layer (PCDTBT:PC$_{70}$BM layer), but since a new hole transport level (indicated by a dotted line, about 5.1 eV) is formed in the p-doped conjugated polymer electrolyte layer (p-doped PFP-Na layer) by the p-doping, the transport of holes may be smoothened.

Meanwhile, a conduction band level of the n-type semiconductor material layer (TiOx layer) 350b is 4.4 eV, which is lower (greater in absolute value) than the LUMO level 4.3 eV of the PC$_{70}$BM which is an electron acceptor material in the second organic active layer (PCDTBT:PC$_{70}$BM layer) 360, and the LUMO level 3.6 eV of the PCDTBT which is an electron donor material. Also, a valence band level of the n-type semiconductor material layer (TiOx layer) 350b is 8.1 eV, which is lower (greater in absolute value) than the HOMO level 5.5 eV of PCDTBT which is an electron donor material in the second organic active layer (PCDTBT:PC$_{70}$BM layer) 340. Therefore, the introduction of electrons into the n-type semiconductor material layer (TiOx layer) 350b from the second organic active layer (PCDTBT:PC$_{70}$BM layer) 360 is easy, while the introduction of holes into the n-type semiconductor material layer (TiOx layer) 350b may be not easy.

Also, the electrons introduced into the n-type semiconductor material layer (TiOx layer) 350b are blocked by the LUMO level of the p-doped conjugated polymer electrolyte layer (p-doped PFP-Na layer) 350a and thus do not further move, and the holes introduced into the p-doped conjugated polymer electrolyte layer (p-doped PFP-Na layer) 350a are blocked by the HOMO level of the n-type semiconductor material layer (TiOx layer) 350b and thus do not further move. Therefore, the electrons and holes may be recombined at an interface between the n-type semiconductor material layer (TiOx layer) 350b and the p-doped conjugated polymer electrolyte layer (p-doped PFP-Na layer) 350a.

Hereinafter, to help the understanding of the present invention, preferred examples will be provided. It will be understood that the following examples are not provided to limit the present invention but are only provided to help the understanding of the present invention.

Synthetic Example 1

Synthesis of p-Doped Conjugated Polymer Electrolyte

[Reaction formula 1]

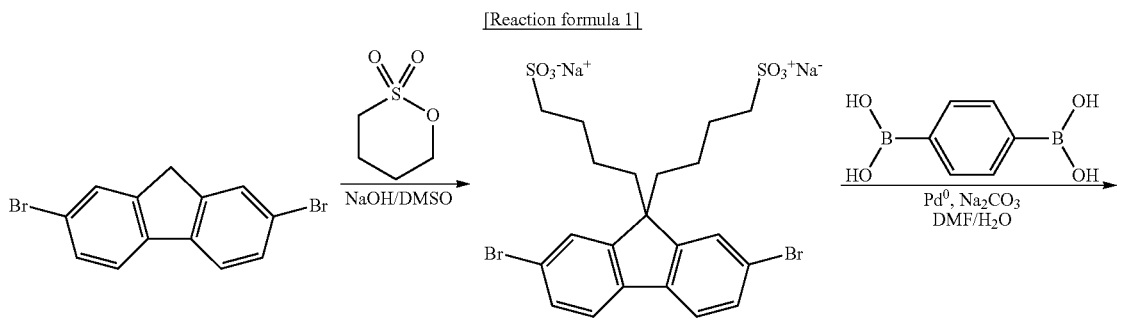

-continued

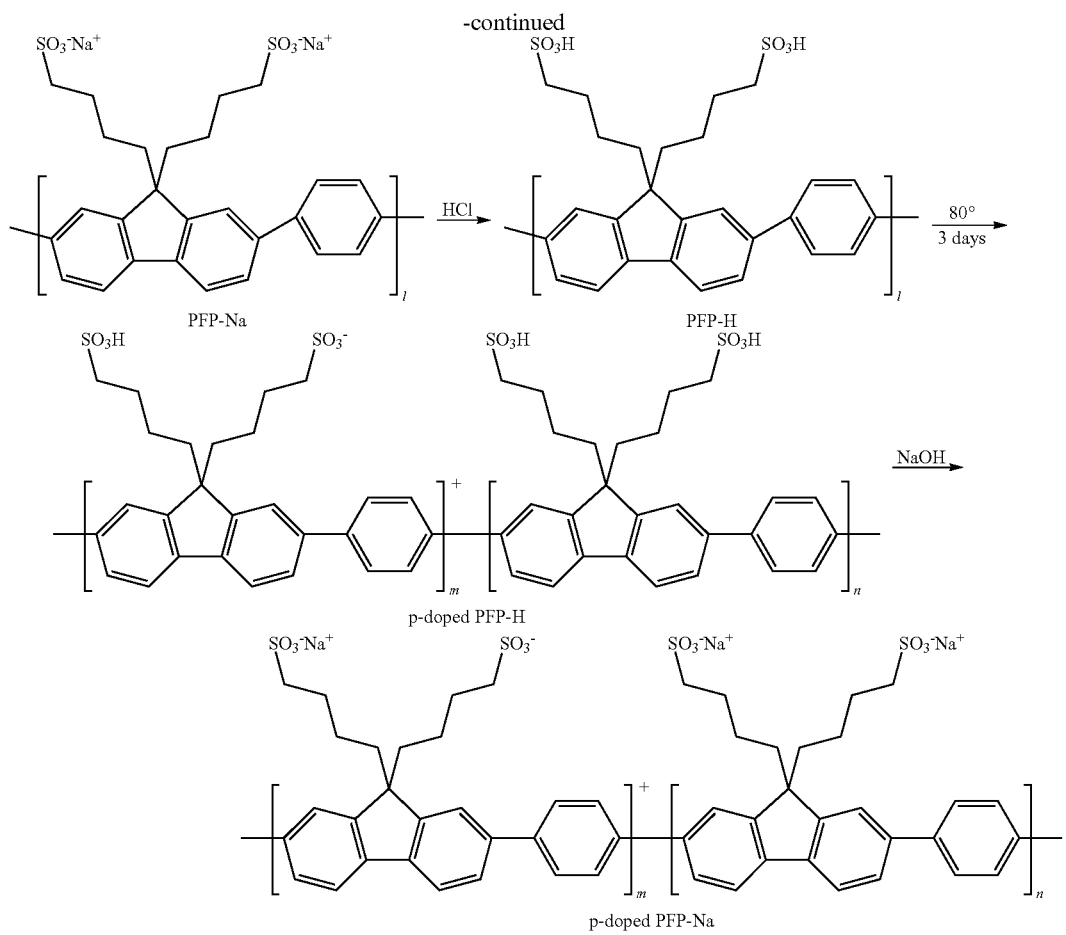

2,7-dibromo-fluorene (5.0 g, 15.4 mmol) and a small amount of triethylbenzylammonium chloride were dissolved with 30 ml of DMSO, and then a reaction was carried out at 60° C. under argon (Ar) atmosphere. After one hour, 1,4-butanesultone (14.9 g, 124 mmol) was added to the reaction mixture. After a reaction of the reaction mixture was again carried out for one hour at 60° C., 10 ml of 50% NaOH aqueous solution was added and then a reaction was carried out for 5 hours at room temperature. NaOH formed was filtered, and washed with ethanol, and the reaction mixture was deposited in 500 ml of acetone. Products were further filtered twice, were washed with ethanol, and were deposited in water and acetone to obtain 6.0 g (65.2%) of an intermediate product (2,7-dibromo-9,9-bis(4'-sulfonatobutyl)(fluorene disodium salt).

The purity and structure of the intermediate product were confirmed by using a 1H-NMR and 13C-NMR, and chemical shift of each NMR was as follows.

$^1$H NMR (200 MHz, DMSO-$d_6$) (ppm): 0.44 (m, 4H), 1.35 (m, 4H), 2.00 (m, 4H) 2.14 (t, 4H, J=7.7 Hz), 7.52 (d, 2H, J=7.97 Hz), 7.72 (s, 2H), 7.78 (d, 2H, J=7.97 Hz)

$^{13}$C NMR (50 MHz, DMSO-$d_6$) (ppm): 22.51, 23.81, 37.41, 50.92, 55.27, 120.99, 121.33, 127.02, 130.36, 138.96, 152.42

Next, the intermediate product (1.0 g, 1.48 mmol), 1,4-phenylenebisboronic acid (250 mg, 1.48 mmol), and Pd(OAc)$_2$ (10 mg) were mixed in a 250 ml reactor, and then 70 ml of 0.5M sodium hydrogen carbonate and 30 ml of DMF were added in the reactor. A reaction of this mixture was carried out for 2 days at 80 under Ar atmosphere. The mixture was cooled to room temperature and then was mixed with 800 ml of acetone. A reaction product deposited was separated, was again dissolved in water, and was dialyzed for 3 days by using a membrane filtering a molecular weight of 10,000. A re-deposited polymer was filtered, washed with water, and placed in a vacuum state for 12 hours at 60 to obtain an aqueous polymer of PFP-Na (Poly(9,9-bis(4'-sulfonatobutyl) fluorene-co-alt-1,4-phenylene) sodium salt).

The purity and structure of the PFP-Na were confirmed by a $^1$H-NMR, and chemical shift thereof was as follows.

1H NMR (200 MHz, CD30D) (ppm): 0.77 (m, 4H), 1.62 (m, 4H), 2.22 (m, 4H), 2.61 (m, 4H), 7.53-7.82 (m, 10H)

Next, the PFP-Na was dissolved in a 10% (w/w) HCl solution so as to completely change sodium ion (Na$^+$) of the PFP-Na into hydrogen ion (H$^+$). An acidized aqueous polymer was added to 500 ml of acetone and deposited. A PFP—H compound formed thus was filtered twice, washed with acetone, and deposited in water and acetone to separate a deposited product. The deposited product was again dissolved in water and dialyzed for 3 days by using a membrane filtering the molecular weight of 10,000. An aqueous polymer PFP—H formed thus was made into a saturated solution under water solvent and then a reaction was carried out for 3 days at 80. As a result, a doped polymer compound (p-doped PFP—H) was obtained by depositing the same in 500 ml of acetone. The doped polymer compound was further filtered twice, washed with acetone, and deposited in water and acetone to separate a resultant product. The p-doped PFP—H (100 mg, 0.2 mmol) was dissolved in 50 ml of water, 10 ml of 0.1M NaOH was added, a reaction was carried out for 1 hour at room temperature to change a pair ion of H$^+$ to Na$^+$, and a product was deposited in 500 ml of acetone to obtain a p-doped PFP-Na and an extra NaOH mixture. A polymer compound obtained from the deposit was dissolved in water, dialyzed for 3 days by using a membrane filtering the molecular weight of 10,000, and deposited in acetone to obtain a pure p-doped PFP-Na.

Synthetic Example 2

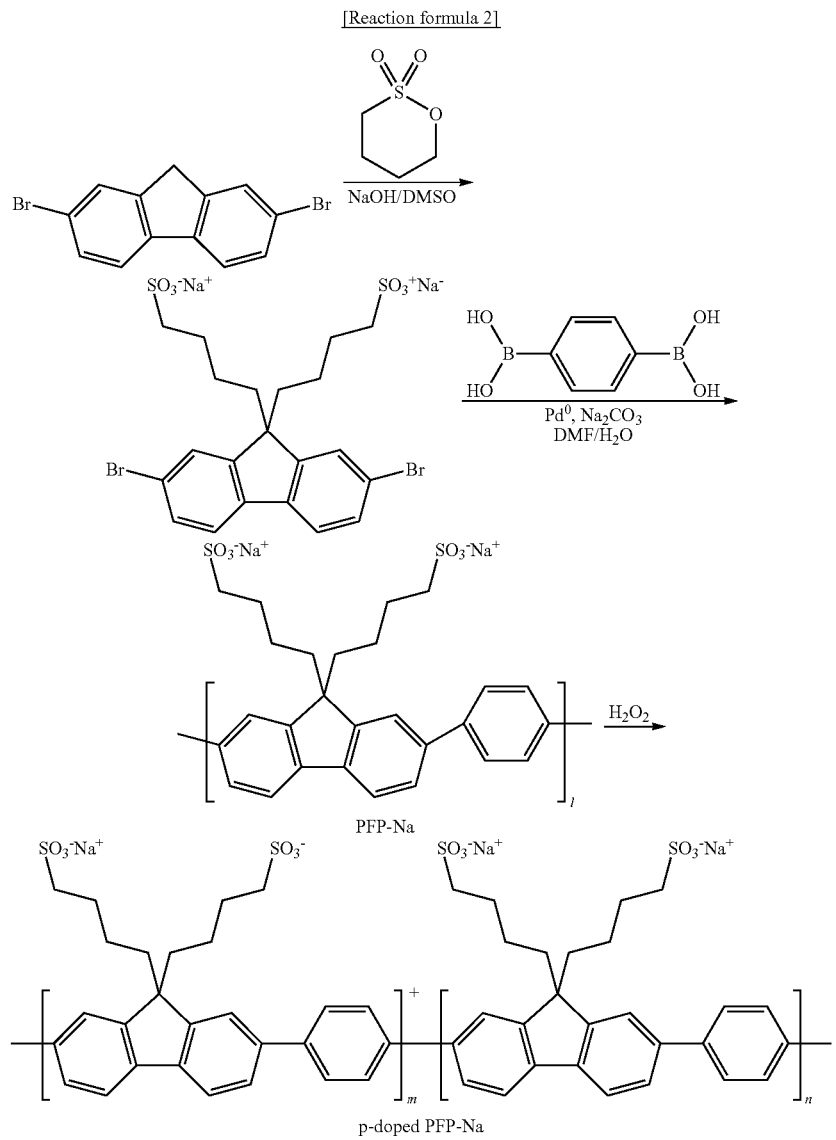

The same method as that in the synthetic example 1 was carried out to obtain a PFP-Na. Next, the PFP-Na (100 mg, 0.18 mmol) was dissolved in 20 ml of water, 20 ml of H$_2$O$_2$ was added, and severely stirred for 24 hours to perform a p-doping into the PFP-Na. The p-doped PFP-Na was added in 500 ml of acetone, deposited, filtered, washed with acetone, and deposited in water and acetone to separate a deposited product. The deposited product was again dissolved in water, and dialyzed for 3 days by using a membrane filtering the molecular weight of 10,000 to obtain a pure p-doped PFP-Na.

Example 1

Manufacturing of an Organic Light Emitting Device Using p-Doped Conjugated Polymer Electrolyte A p-doped PFP-Na layer was formed to a thickness of 30 nm by using a spin coating as a hole transport layer on a glass substrate deposited with a 150 nm thick ITO film. Afterwards, an MEH-PPV layer was formed to a thickness of 80 nm as a light emitting layer by using a spin coating on the p-doped PFP-Na layer. Lastly, a Ca film and an Al film was formed to thicknesses of 20 nm and 100 nm, respectively on the MEH-PPV layer by using a thermal evaporator in a vacuum state of 10$^{-7}$ torr, thereby manufacturing an organic light emitting device.

Comparative Example 1

An organic light emitting device was manufactured by using the same method as that in Example 1 except that a PEDOT:PSS layer was used as a hole transport layer instead of a p-doped PFP-Na layer.

Figure 8:
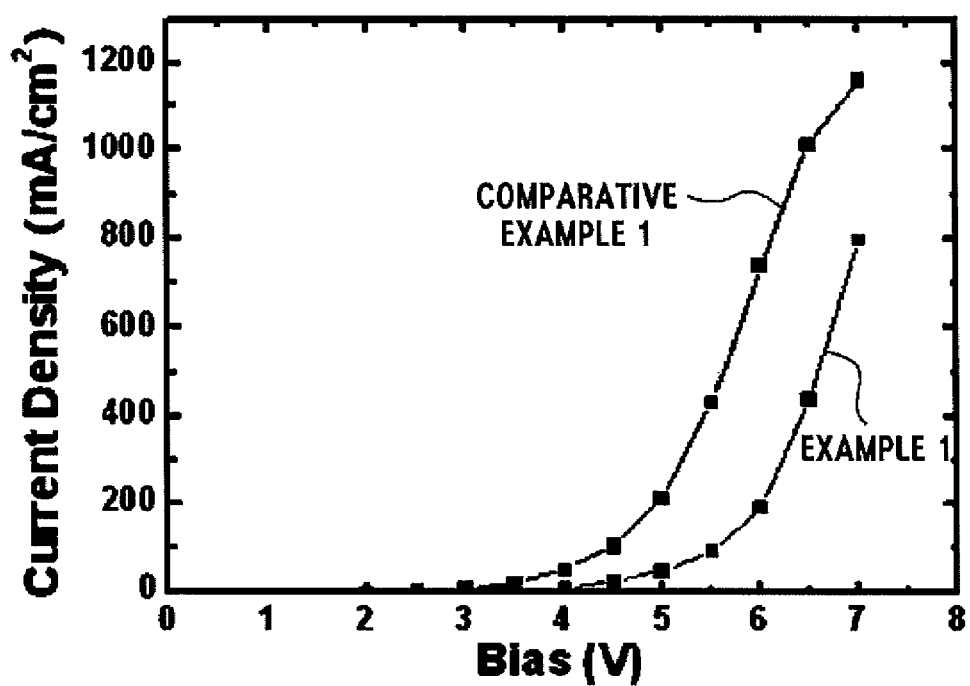
FIG. 8 illustrates a current-voltage curve of organic light emitting devices manufactured respectively in Example 1 and Comparative example 1.

FIG. 8 illustrates a current-voltage curve of organic light emitting devices manufactured respectively in Example 1 and comparative example 1.

Figure 9:
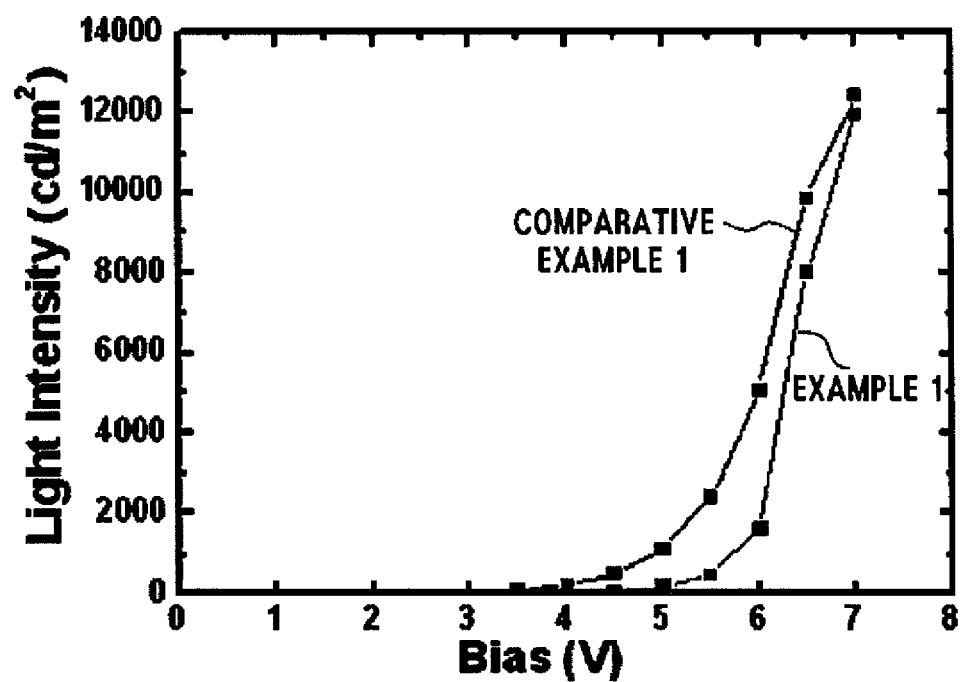
FIG. 9 illustrates a brightness-voltage curve of organic light emitting devices manufactured respectively in Example 1 and Comparative example 1.

FIG. 9 illustrates a brightness-voltage curve of organic light emitting devices manufactured respectively in Example 1 and Comparative example 1.

Referring to FIGS. 8 and 9, under the same voltage, the organic light emitting device in Example 1 exhibits a lower current density than, and a similar maximum brightness to the organic light emitting device in Comparative example 1. This result indicates that the organic light emitting device in Example 1 has a higher efficiency than the organic light emitting device in Comparative example 1 since in the case of the organic light emitting device in Example 1, although the numbers of electrons and holes injected are small, brightness exhibited due to recombination of those electrons and holes is similar to that in the organic light emitting device in Comparative example 1.

Figure 10:
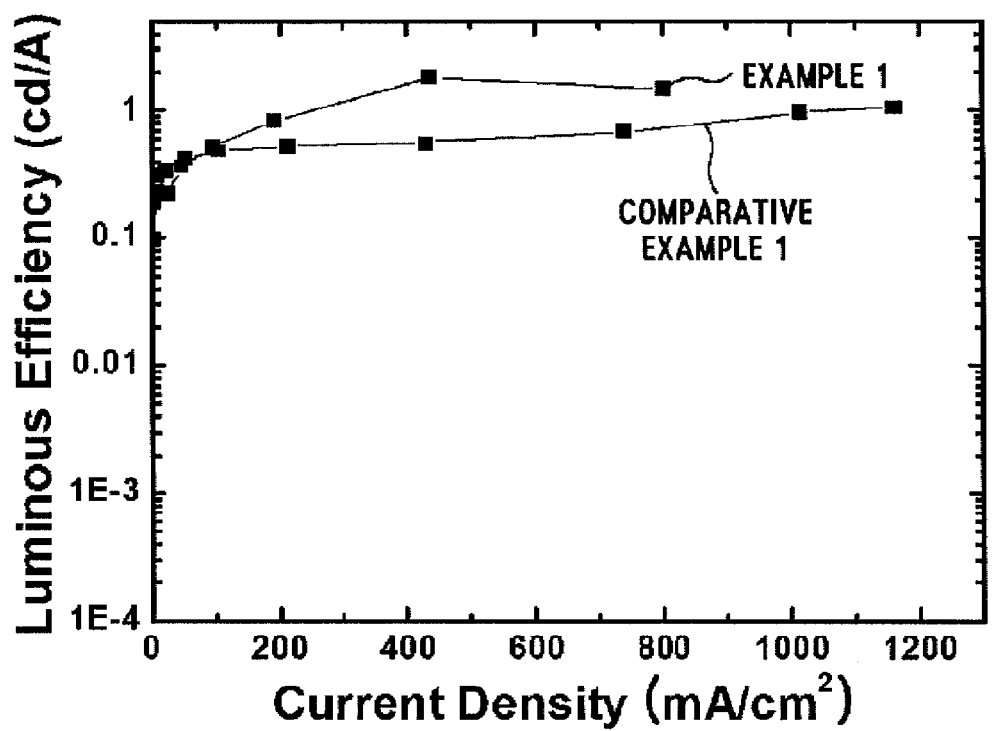
FIG. 10 illustrates a current-voltage curve of organic light emitting devices manufactured respectively in Example 1 and Comparative example 1.

FIG. 10 illustrates a current-voltage curve of organic light emitting devices manufactured respectively in Example 1 and Comparative example 1.

Referring to FIG. 10, the organic emitting device in Comparative 1 exhibits a maximum efficiency of 1 cd/A, while the organic light emitting device in Example 1 exhibits a maximum efficiency of 1.8 cd/A, which is two times higher than the maximum efficiency of the organic light emitting device in Comparative example 1.

That is, since the organic light emitting device which uses the p-doped conjugated polymer electrolyte layer as a hole transport layer is driven under a lower current than the organic light emitting device which uses the PEDOT:PSS layer as a hole transport layer, it can be confirmed that characteristics of the device can be prevented from being lowered due to overcurrent, and a high efficiency can be obtained.

Example 2

Manufacturing of an Organic Solar Cell Using p-Doped Conjugated Polymer Electrolyte A p-doped PFP-Na layer was formed up to a thickness of 30 nm by using a spin coating as a hole transport layer on a glass substrate deposited with a 150 nm thick ITO film. Afterwards, a solution in which an electron donor material of PCDTBT and an electron acceptor material of $PC_{70}BM$ were mixed in a ratio of 1:4 was spin-coated on the p-doped PFP-Na layer to form a photoelectric conversion layer to a thickness of 60 nm. Next, a 5 nm thick electron transport layer was formed on the photoelectric conversion layer by using a titanium oxide solution diluted in alcohol in a ratio of 1:200, and lastly an Al film was formed to a thickness of 100 nm by using a thermal evaporator in a vacuum state of $10^{-7}$ torr, thereby manufacturing an organic solar cell.

Comparative Example 2

An organic solar cell was manufactured by using the same method as that in Example 2 except that a PEDOT:PSS layer was used as a hole transport layer instead of a p-doped PFP-Na layer.

Figure 11:
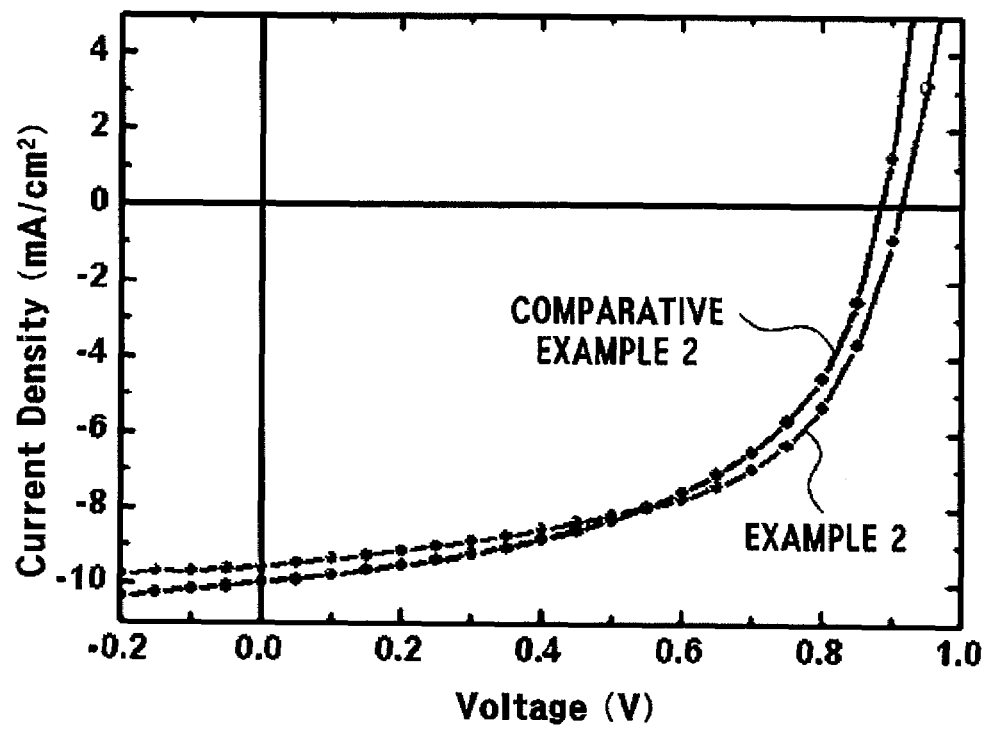
FIG. 11 illustrates a current-voltage curve of organic light emitting devices manufactured respectively in Example 2 and Comparative example 2.

FIG. 11 illustrates a current-voltage curve of organic solar cells manufactured respectively in Example 2 and comparative example 2. The current-voltage characteristic was examined by illuminating light corresponding to a sun light spectrum of a 1.5 air mass (A.M.) condition (100 $mW/cm^2$) to typically measure the performance of a solar cell to the devices.

Referring to FIG. 11, it could be confirmed that the organic solar cell in Example 2 exhibited about 5% energy conversion efficiency, which was similar to that in Comparative example 2.

Example 3

An organic solar cell was manufactured by using a similar method to that in Example 2, in which the doping level of the p-doped PFP-Na layer used as a hole transport layer was made different. The doping level was adjusted by making the acid (HCl) treating time or the reaction temperature different in the course of synthesizing the p-doped PFP—H in Synthetic example 1.

Figure 12:
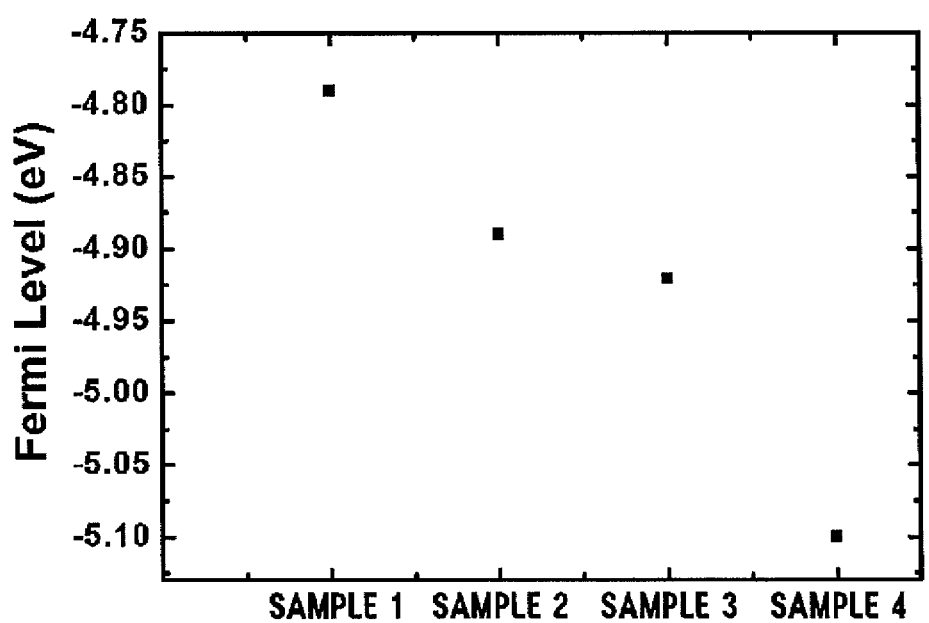
FIG. 12 illustrates Fermi levels of p-doped PFP-Na layers made with different doping levels.

FIG. 12 illustrates Fermi levels of p-doped PFP-Na layers made with different doping levels. Herein, the sequence of samples 1 to 4 indicates PFP-Na sample 1 having the highest doping level to PFP-Na sample 4 having the lowest doping level.

Figure 13:
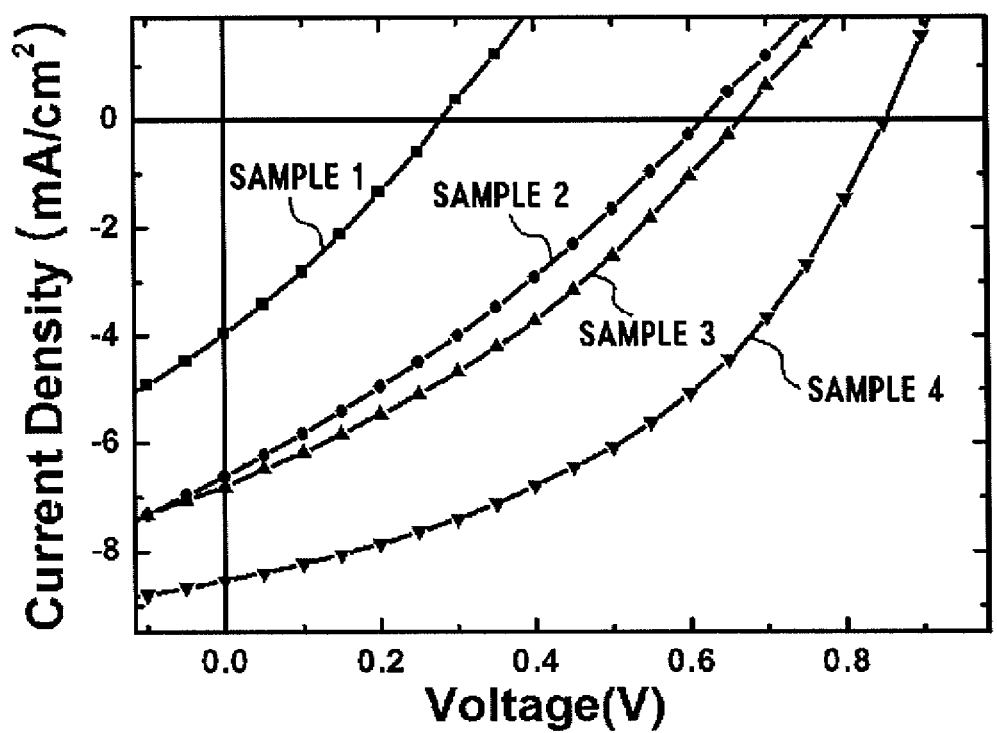
FIG. 13 is a current-voltage curve of organic solar cells manufactured by using p-doped PFP-Na layers made with different doping levels as hole transport layers.

FIG. 13 is a current-voltage curve of organic solar cells prepared by using p-doped PFP-Na layers made with different doping levels as hole transport layers. Herein, the sequence of samples 1 to 4 indicates solar cell sample 1 having a PFP-Na layer having a highest doping level as a hole transport layer to sample 4 having a PFP-Na layer having a lowest doping level as a hole transport layer.

Referring to FIGS. 12 and 13, as the doping level of the conjugated polymer electrolyte increases, it can be seen that the Fermi level decreases but an open voltage of the organic solar cell increases. This is because the increase in doping level increases the concentration of carriers and thus enhances the performance of the layer as a hole transport layer.

Example 4

An organic light emitting device was manufactured by using the same method as that in Example 1 except that a p-doped PFP-Na layer was coated on an ITO electrode and was placed for 24 hours in air.

Comparative Example 4

An organic light emitting device was manufactured by using the same method as that in Example 1 except that a PEDOT:PSS layer was coated on an ITO electrode instead of a p-doped PFP-Na layer and was placed for 24 hours in air.

Figure 14:
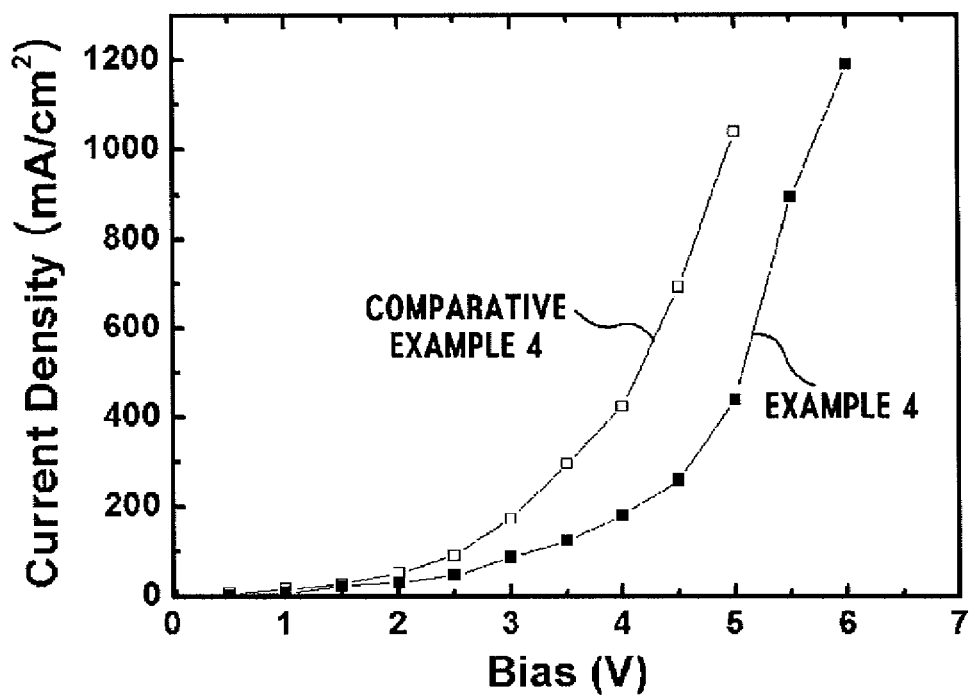
FIG. 14 illustrates a current-voltage curve of organic light emitting devices manufactured respectively in Example 4 and Comparative example 4.

FIG. 14 illustrates a current-voltage curve of organic light emitting devices manufactured respectively in Example 4 and Comparative example 4.

Figure 15:
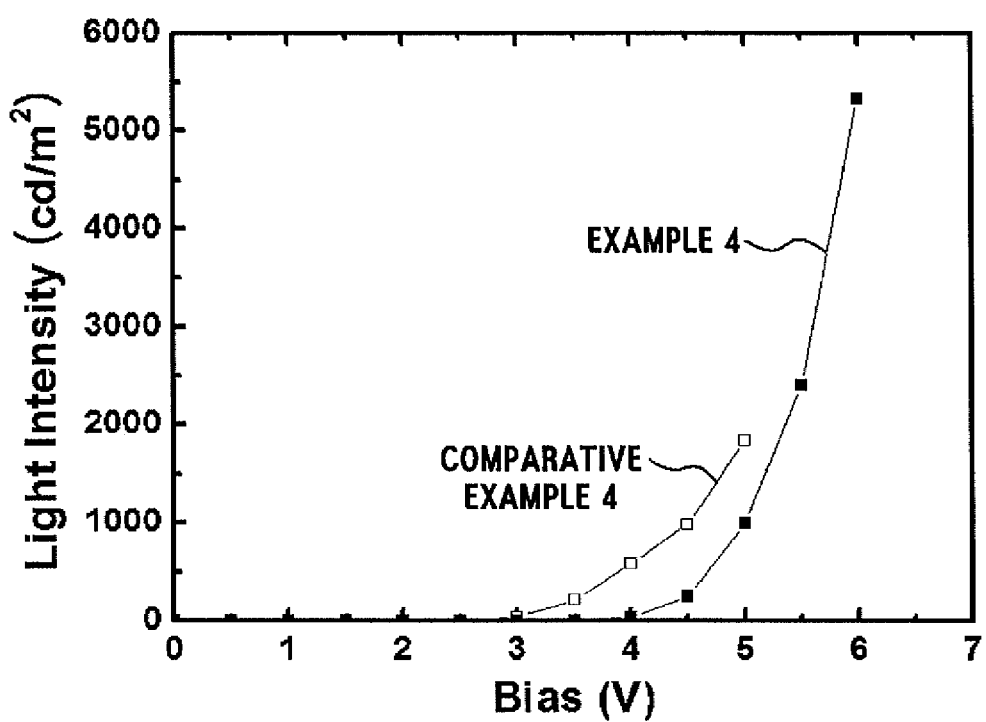
FIG. 15 illustrates a brightness-voltage curve of organic light emitting devices manufactured respectively in Example 4 and Comparative example 4.

FIG. 15 illustrates a brightness-voltage curve of organic light emitting devices manufactured respectively in Example 4 and Comparative example 4.

Figure 16:
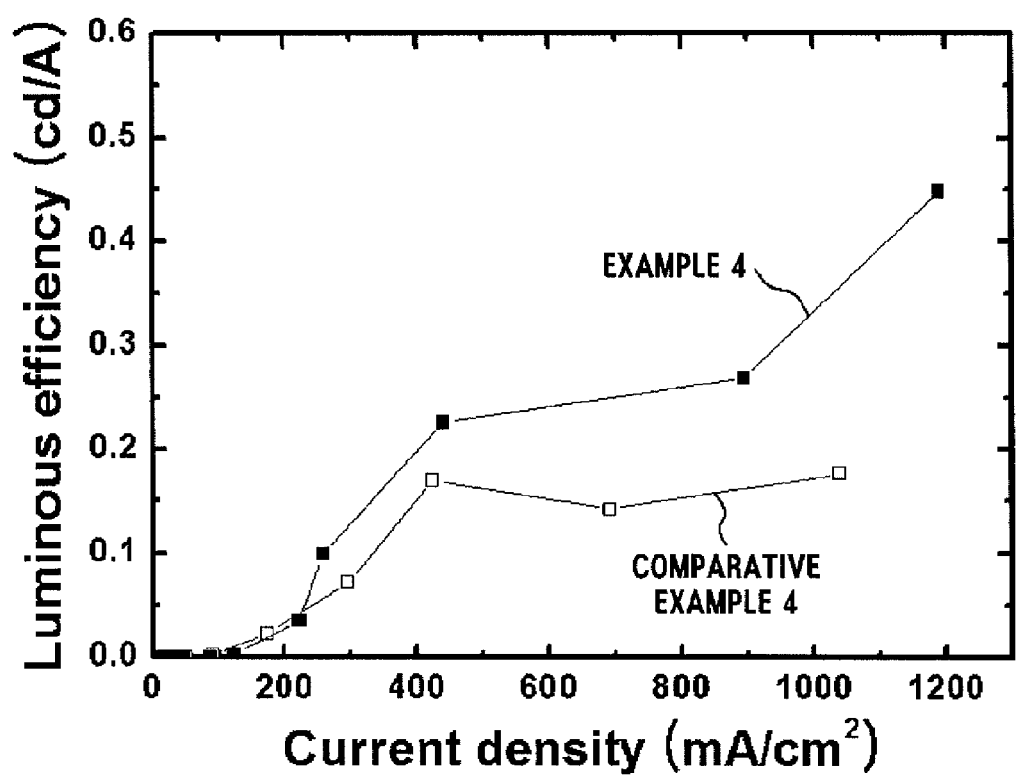
FIG. 16 illustrates a current-voltage curve of organic light emitting devices manufactured respectively in Example 4 and Comparative example 4.

FIG. 16 illustrates a current-voltage curve of organic light emitting devices manufactured respectively in Example 4 and Comparative example 4.

Referring to FIGS. 14 to 16, it can be seen that the organic light emitting devices having a p-doped PFP-Na layer as a hole transport layer have superior characteristics. This is because the PEDOT:PSS has a strong acidity of about pH 1, it corrodes the ITO electrode according to humidity and temperature and thus decreases lift-cycle and efficiency of the device.

As described above, according to the present invention, by using a p-doped polymer electrolyte layer as a hole transport layer for organic light emitting devices and organic solar cells, life-cycle and efficiency of the devices can be enhanced. Also, since various kinds of p-doped conjugated polymer electrolytes may be used to thus introduce a buffer layer (hole transport layer) having an appropriate energy level, it is possible to provide means capable of easily improving efficiency of such a device.

While the present invention has been described in detail with reference to preferred embodiments thereof, it will be understood by those of ordinary skill in the art that various modifications and changes may be made therein without departing from the technical spirits and scope of the present invention.

The invention claimed is:

1. A p-doped conjugated polymer compound containing a compound expressed by formula 1:

<formula 1>

where $Ar_1$ is any one selected from the following first compound group, $Ar_2$ is any one selected from the following second compound group, superscript "+" in the square bracket indicates an oxidized portion of a main chain of a polymer, each of m and n independently represents an integer between 1 and 1,000,000, <First compound group>

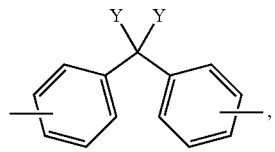

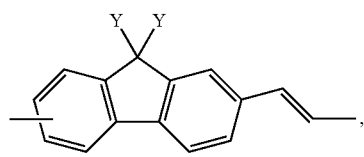

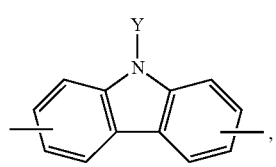

-continued

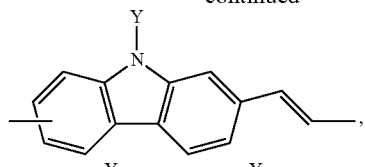

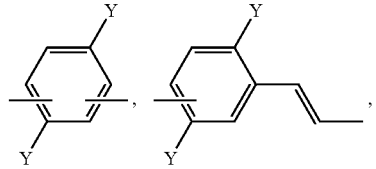

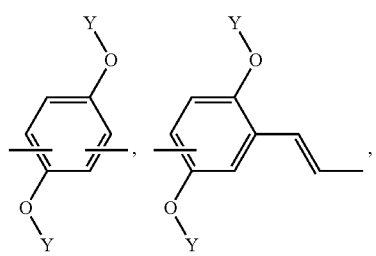

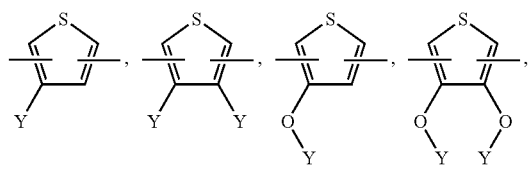

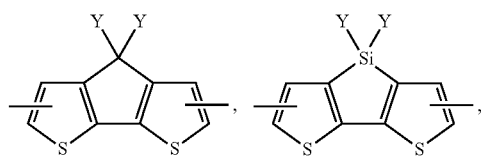

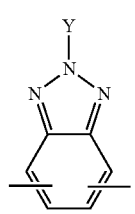

Y is $-C_nH_{2n}-X$ (n is an integer between 1 and 20), X is any one of selected from the group consisting of $-SO_3-$, $-CO_2-$, and $-N^+R_1R_2R_3$, and $R_1$, R2, or $R_3$ is any one selected from C1 to C3 alkyl groups, <Second compound group>

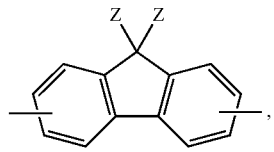

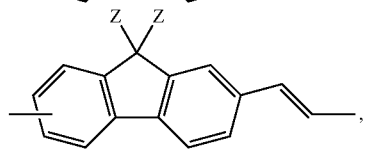

-continued

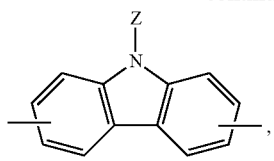

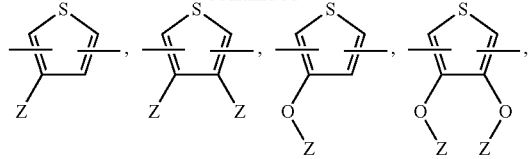

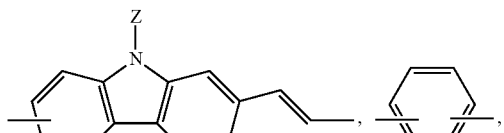

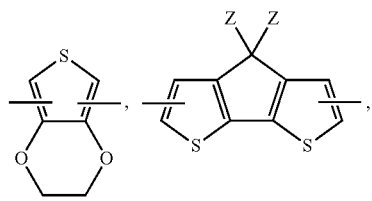

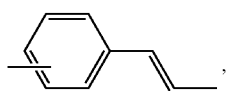

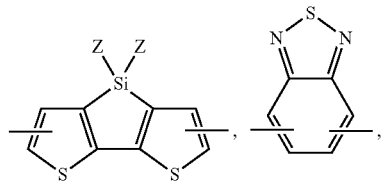

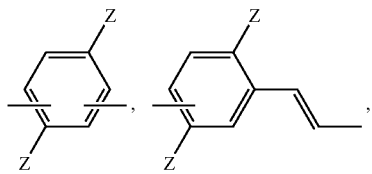

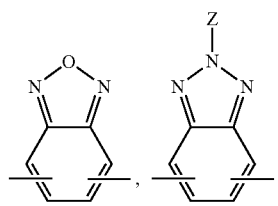

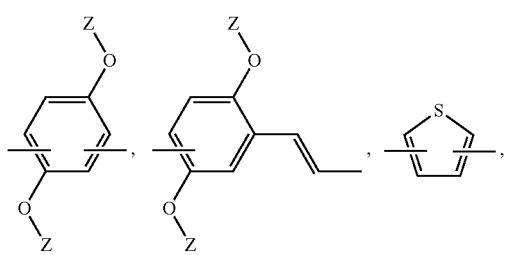

Z is a C1 to C20 alkyl group.

2. The p-doped conjugated polymer electrolyte of claim 1, wherein the p-doped conjugated polymer electrolyte contains any one selected from the group consisting of $H^+$, $Na^+$, $K^+$, $NH_4^+$, $NMe_4^+$, and $Cs^+$ as a counter positive ion, and any one selected from the group consisting of $Br^-$, $BF_4^-$, $CF_3SO_3^-$, $PF_6^-$, $BPh_4^-$, and $BAr^F_4$ $(B(3,5-(CF_3)_2C_6H_3)_4)$ as a counter negative ion.

3. The p-doped conjugated polymer electrolyte of claim 1, wherein the p-doped conjugated polymer electrolyte is a compound expressed by formula 2:

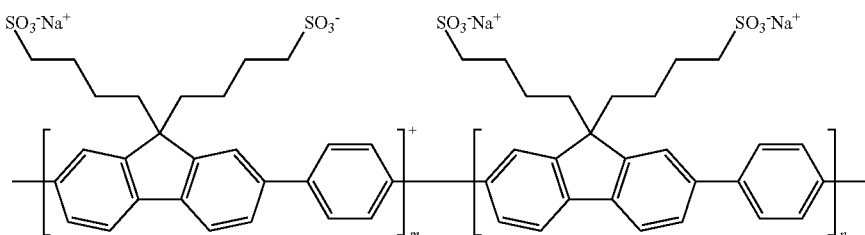

where superscript "+" indicates an oxidized portion of the main chain of the polymer, and each of m and n independently represents an integer between 1 and 1,000,000.

4. An organic light emitting device comprising:

a first electrode;

a p-doped conjugate polymer electrolyte layer on the first electrode;

an organic active layer on the polymer electrolyte layer; and a second electrode on the organic active layer, wherein the p-doped conjugate polymer electrolyte layer contains a compound expressed by formula 1:

<formula 1>

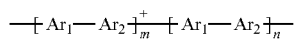

where $Ar_1$ is any one selected from the following first compound group, $Ar_2$ is any one selected from the following second compound group, superscript "+" in the square bracket indicates an oxidized portion of a main chain of a polymer, each of m and n independently represents an integer between 1 and 1,000,000, <First compound group>

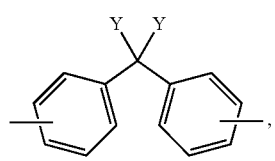

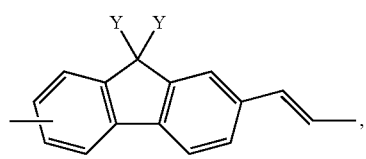

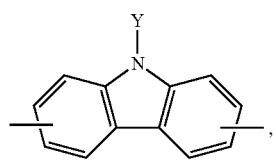

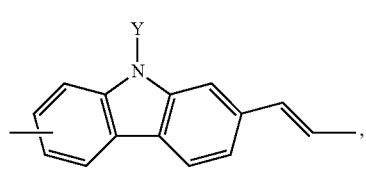

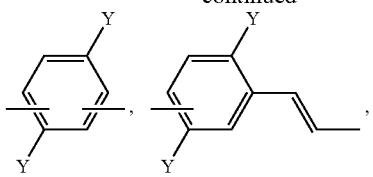

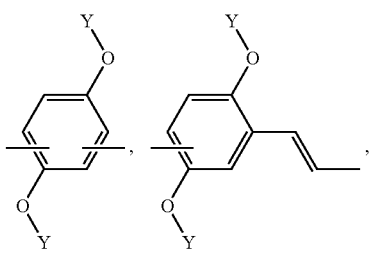

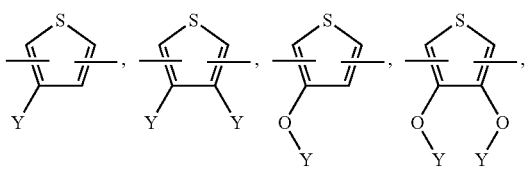

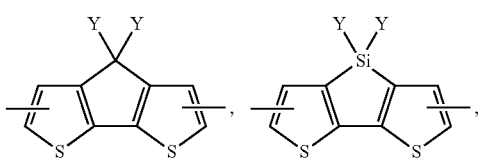

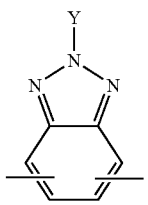

Y is —$C_nH_{2n}$—X (n is an integer between 1 and 20), X is any one of selected from the group consisting of —$SO_3$—, —$CO_2$—, and —$N^+R_1R_2R_3$, and $R_1$, R2, or $R_3$ is any one selected from C1 to C3 alkyl groups, <Second compound group>

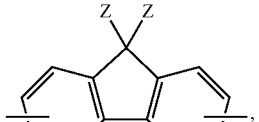

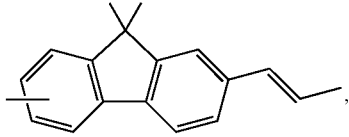

-continued

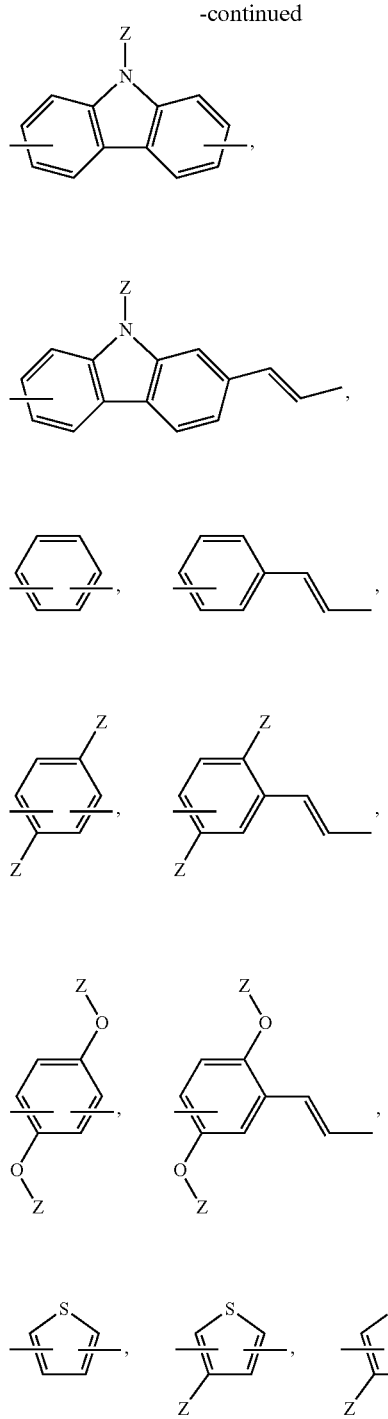

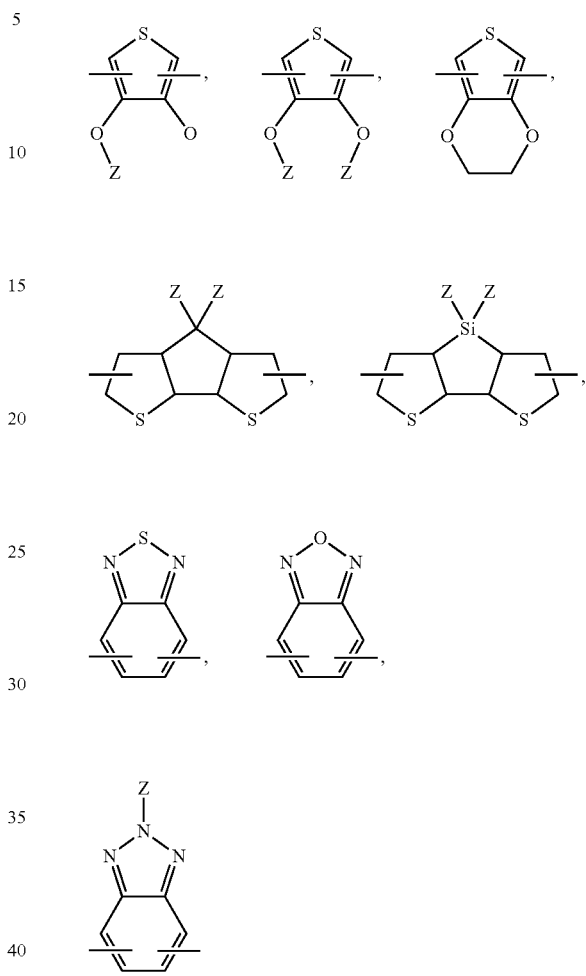

Z is a C1 to C20 alkyl group.

5. The organic light emitting device of claim 4, wherein the p-doped conjugated polymer electrolyte contains any one selected from the group consisting of $H^+$, $Na^+$, $K^+$, $NH_4^+$, $NMe_4^+$, and $Cs^+$ as a counter positive ion, and any one selected from the group consisting of $Br^-$, $BF_4^-$, $CF_3SO_3^-$, $PF_6^-$, $BPh_4^-$, and $BAr^F_4(B(3,5-(CF_3)_2C_6H_3)_4)$ as a counter negative ion.

6. The organic light emitting device of claim 4, wherein the p-doped conjugated polymer electrolyte is a compound expressed by formula 2:

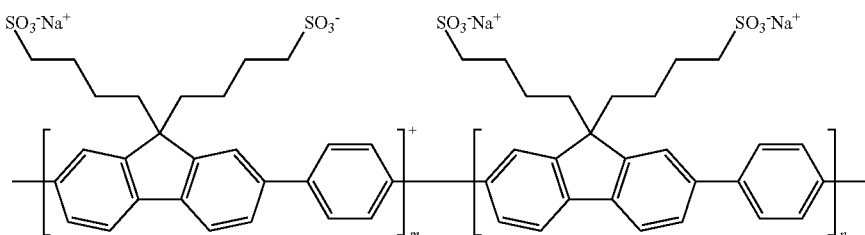

where superscript "+" indicates an oxidized portion of the main chain of the polymer, and each of m and n independently represents an integer between 1 and 1,000,000.

7. The organic light emitting device of claim 4, wherein the organic active layer is a light emitting layer or a photoelectric conversion layer.

8. The organic light emitting device of claim 4, further comprising an electron transport layer between the organic active layer and the second electrode.

9. The organic light emitting device of claim 8, wherein the electron transport layer is a titanium oxide layer.

10. A stack type organic solar cell comprising:
a first electrode;
a first organic active layer on the first electrode;
a charge recombination layer disposed on the first organic active layer and provided with an n-type semiconductor material layer and a p-doped conjugated polymer electrolyte layer;
a second organic active layer on the charge recombination layer, and
a second electrode on the second organic active layer,
wherein the p-doped conjugated polymer electrolyte layer contains a compound expressed by formula 1:

<formula 1>

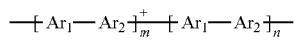

where $Ar_1$ is any one selected from the following first compound group,
$Ar_2$ is any one selected from the following second compound group,
superscript "+" in the square bracket indicates an oxidized portion of a main chain of a polymer,
each of m and n independently represents an integer between 1 and 1,000,000, <First compound group>

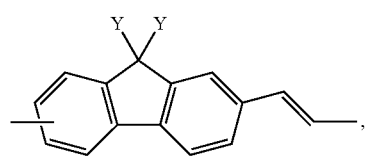

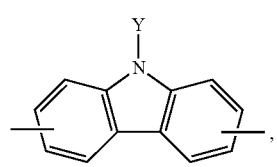

-continued

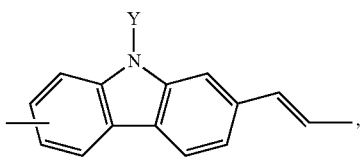

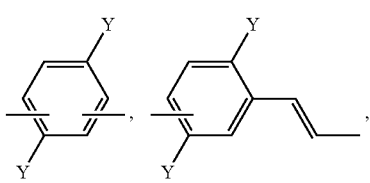

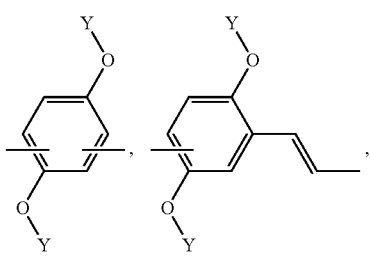

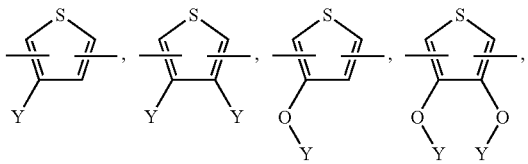

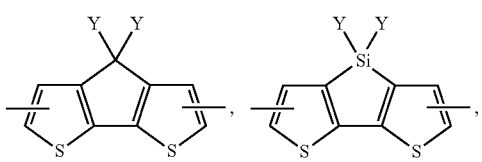

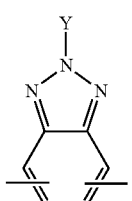

Y is $-C_nH_{2n}-X$ (n is an integer between 1 and 20), X is any one of selected from the group consisting of $-SO_3-$, $-CO_2-$, and $-N^+R_1R_2R_3$, and $R_1$, R2, or $R_3$ is any one selected from C1 to C3 alkyl groups, <Second compound group>

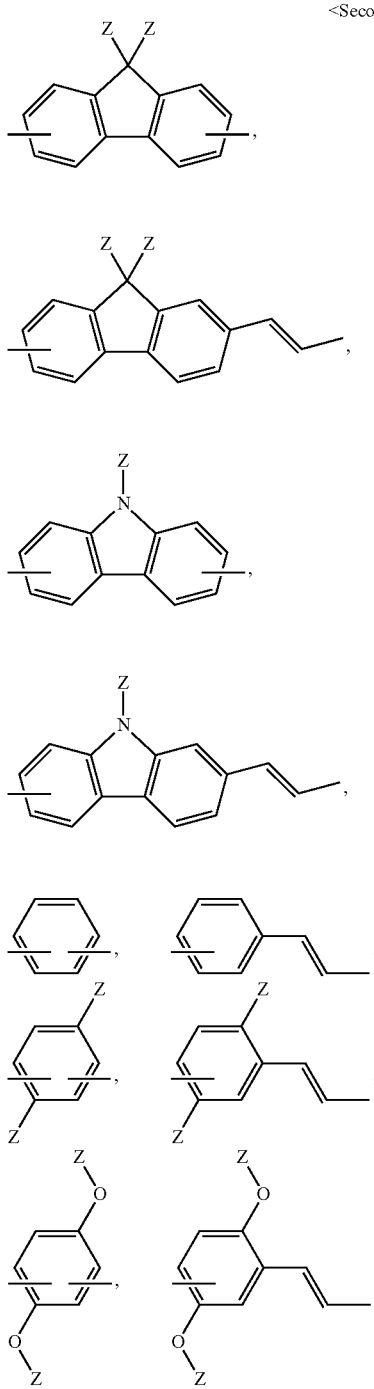
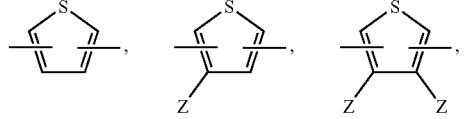
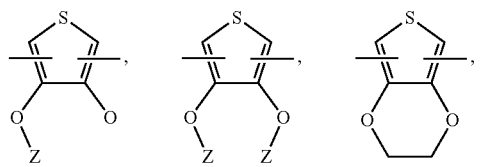
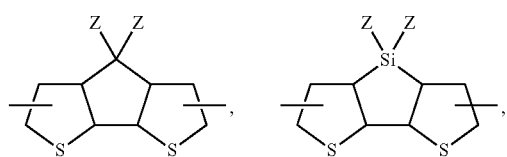
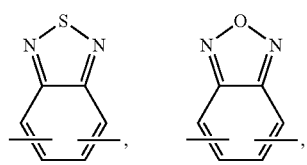
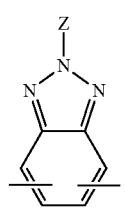

Z is a C1 to C20 alkyl group.

11. The organic solar cell of claim 10, wherein the p-doped conjugated polymer electrolyte layer contains any one selected from the group consisting of $H^+$, $Na^+$, $K^+$, $NH_4^+$, $NMe_4^+$, and $Cs^+$ as a counter positive ion, and any one selected from the group consisting of $Br^-$, $BF_4^-$, $CF_3SO_3^-$, $PF_6^-$, $BPh_4^-$, and $BAr^F_4 (B(3,5-(CF_3)_2C_6H_3)_4)$ as a counter negative ion.

12. The organic solar cell of claim 10, wherein the p-doped conjugated polymer electrolyte is a compound expressed by formula 2:

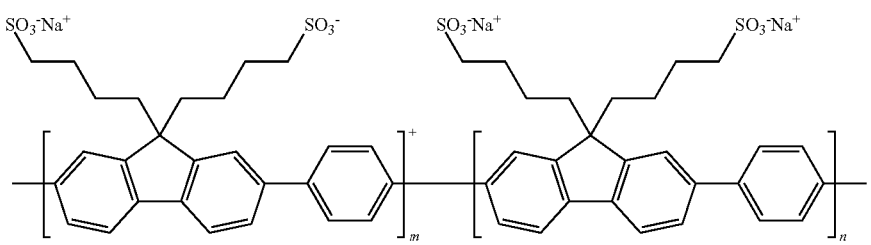

where superscript "+" indicates an oxidized portion of the main chain of the polymer, and each of m and n independently represents an integer between 1 and 1,000,000.

13. The organic solar cell of claim 10, wherein the n-type semiconductor material layer is a metal oxide layer.

14. The organic solar cell of claim 13, wherein the metal oxide is at least any one selected from the group consisting of titanium oxide, zinc oxide, tungsten oxide, vanadium oxide, and molybdenum oxide.

15. The organic solar cell of claim 10, further comprising at least one of a hole transport layer and an electron transport layer which are disposed between the first electrode and the first organic active layer, or between the second organic active layer and the second electrode.

16. The organic solar cell of claim 15, wherein the hole transport layer is a p-doped conjugated polymer electrolyte layer containing a compound expressed by formula 1:

<formula 1>

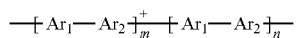

where $Ar_1$ is any one selected from the following first compound group, $Ar_2$ is any one selected from the following second compound group, superscript "+" in the square bracket indicates an oxidized portion of a main chain of a polymer, each of m and n independently represents an integer between 1 and 1,000,000, <First compound group>

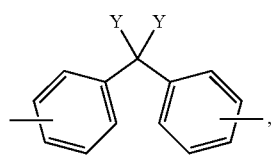

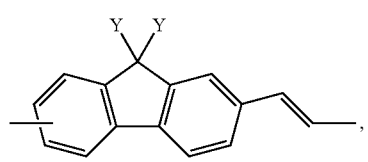

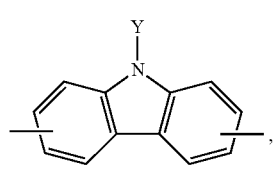

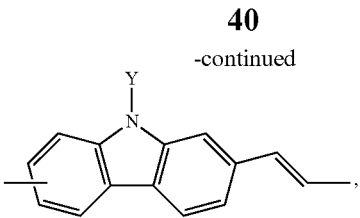

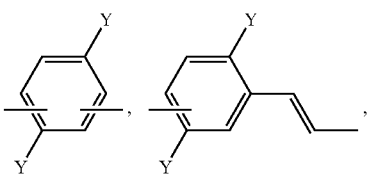

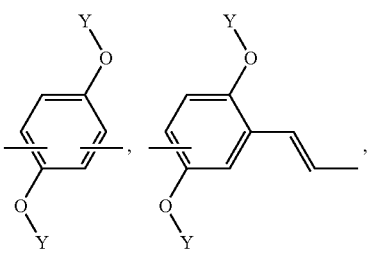

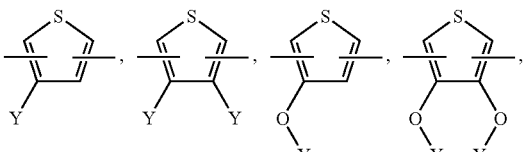

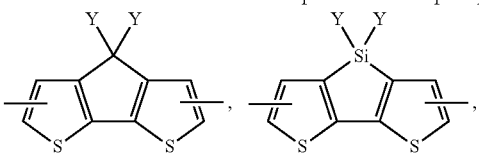

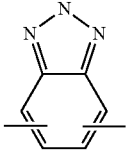

Y is —$C_nH_{2n}$—X (n is an integer between 1 and 20), X is any one of selected from the group consisting of —$SO_3$—, —$CO_2$—, and —$N^+R_1R_2R_3$, and $R_1$, R2, or $R_3$ is any one selected from C1 to C3 alkyl groups, <Second compound group>

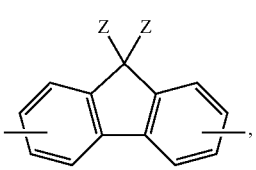

-continued

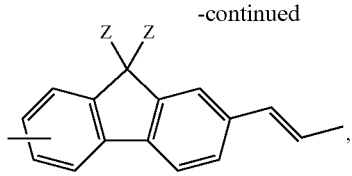
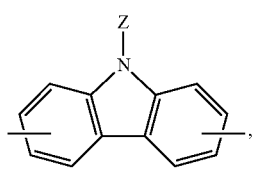
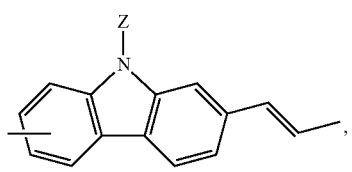
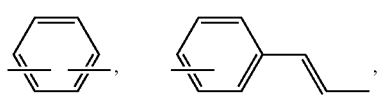
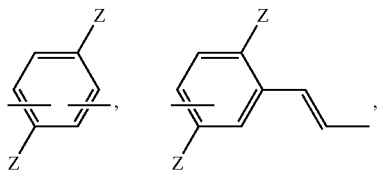
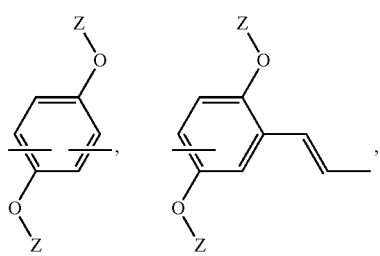

-continued

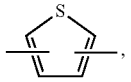 , 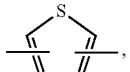 , 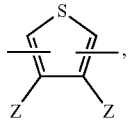 ,

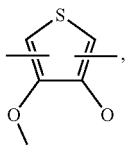 , 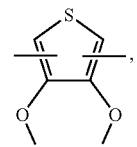 , 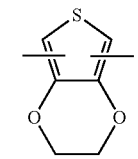 ,

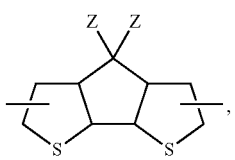 , 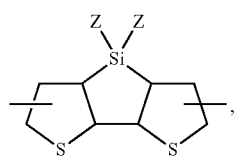 ,

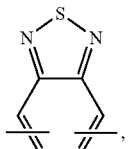 , 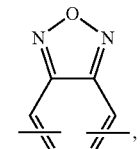 ,

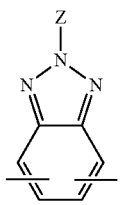

Z is a C1 to C20 alkyl group.

17. The organic solar cell of claim 16, wherein the p-doped conjugated polymer electrolyte layer contains any one selected from the group consisting of $H^+$, $Na^+$, $K^+$, $NH_4^+$, $NMe_4^+$, and $Cs^+$ as a counter positive ion, and any one selected from the group consisting of $Br^-$, $BF_4^-$, $CF_3SO_3^-$, $PF_6^-$, $BPh_4^-$, and $BAr^F_4(B(3,5-(CF_3)_2C_6H_3)_4)$ as a counter negative ion.

18. The organic solar cell of claim 15, wherein the hole transport layer is a p-doped conjugated polymer electrolyte layer containing a compound expressed by formula 2:

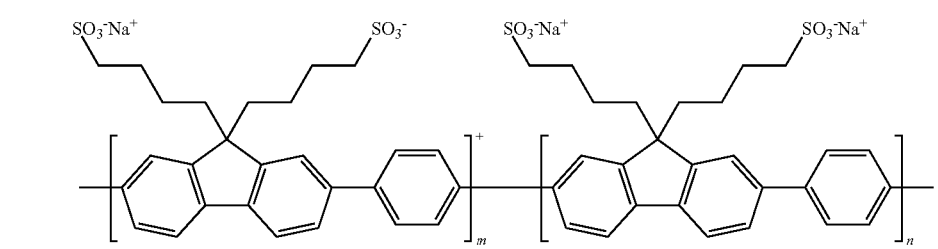

where superscript "+" indicates an oxidized portion of the main chain of the polymer, and each of m and n independently represents an integer between 1 and 1,000,000.

19. The organic solar cell of claim 15, wherein the electron transport layer is a titanium oxide layer.

* * * * *